(12) United States Patent
Kuwabara

(10) Patent No.: US 10,516,118 B2
(45) Date of Patent: Dec. 24, 2019

(54) ELECTRONIC DEVICE, DISPLAY DEVICE, METHOD FOR MANUFACTURING THE SAME, AND SYSTEM INCLUDING A PLURALITY OF DISPLAY DEVICES

(71) Applicant: Semiconductor Energy Laboratory Co., Ltd., Atsugi-shi, Kanagawa-ken (JP)

(72) Inventor: Hideaki Kuwabara, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 120 days.

(21) Appl. No.: 15/272,533

(22) Filed: Sep. 22, 2016

(65) Prior Publication Data

US 2017/0092230 A1    Mar. 30, 2017

(30) Foreign Application Priority Data

Sep. 30, 2015   (JP) .................................. 2015-195163
Jan. 29, 2016   (JP) .................................. 2016-015357

(51) Int. Cl.
*H01L 51/00*       (2006.01)
*G06F 3/14*        (2006.01)
*H01L 27/32*       (2006.01)
*H01L 51/52*       (2006.01)

(52) U.S. Cl.
CPC ........ *H01L 51/0097* (2013.01); *G06F 3/1423* (2013.01); *H01L 27/3276* (2013.01); *H01L 51/5253* (2013.01); *G09G 2360/144* (2013.01); *G09G 2380/02* (2013.01); *Y02E 10/549* (2013.01)

(58) Field of Classification Search
None
See application file for complete search history.

(56) References Cited

U.S. PATENT DOCUMENTS

| 2005/0274949 | A1* | 12/2005 | Yamazaki | ........... H01L 51/5206 |
| | | | | 257/59 |
| 2008/0018229 | A1* | 1/2008 | Yamazaki | ........... H01L 27/3246 |
| | | | | 313/498 |
| 2008/0073646 | A1 | 3/2008 | Khan | |
| 2008/0284970 | A1 | 11/2008 | Ishitani | |
| 2009/0169916 | A1* | 7/2009 | Lee | ..................... H01L 23/4985 |
| | | | | 428/620 |

(Continued)

FOREIGN PATENT DOCUMENTS

JP      2015-062060       4/2015

*Primary Examiner* — Nitin Patel
*Assistant Examiner* — Amen Woldesenbet Bogale
(74) *Attorney, Agent, or Firm* — Robinson Intellectual Property Law Office; Eric J. Robinson

(57) ABSTRACT

A power saving system using a plurality of flexible display devices placed on various places is provided. A structure of a bendable portion in a display device is improved. Specifically, a wiring partly including a metal nanoparticle is used. Openings are formed in an insulating layer so that the wiring becomes substantially longer by meandering in cross section. When a plurality of openings are formed and aligned, a portion that is easy to bend is formed along the line where they are aligned. A plurality of display panels are used for one display portion. The flexible display portion can be provided on a surface, specifically, a curved surface of furniture such as a chair or a sofa.

18 Claims, 16 Drawing Sheets

(56) References Cited

U.S. PATENT DOCUMENTS

| | | | |
|---|---|---|---|
| 2009/0170286 A1* | 7/2009 | Tsukamoto | C30B 33/04 438/458 |
| 2010/0101839 A1* | 4/2010 | Saran | B82Y 20/00 174/256 |
| 2010/0177259 A1* | 7/2010 | Ichioka | G02F 1/133308 349/58 |
| 2011/0018788 A1* | 1/2011 | Tanaka | H01L 51/5246 345/80 |
| 2012/0062814 A1* | 3/2012 | Yamazaki | G02F 1/1333 349/43 |
| 2014/0008668 A1* | 1/2014 | Hirakata | H01L 27/15 257/79 |
| 2014/0217373 A1* | 8/2014 | Youn | H01L 23/4985 257/40 |
| 2014/0217397 A1* | 8/2014 | Kwak | H01L 27/1218 257/43 |
| 2014/0232956 A1* | 8/2014 | Kwon | G02F 1/133305 349/12 |
| 2014/0254111 A1* | 9/2014 | Yamazaki | H01L 51/0097 361/749 |
| 2014/0292046 A1* | 10/2014 | Westerink | B64D 11/0015 297/217.3 |
| 2015/0048349 A1 | 2/2015 | Kawata | |
| 2015/0179728 A1* | 6/2015 | Kwon | H01L 27/3276 257/40 |
| 2015/0228704 A1 | 8/2015 | Miyake et al. | |
| 2016/0014882 A1* | 1/2016 | Jongman | G02F 1/13452 361/749 |
| 2016/0019019 A1 | 1/2016 | Ikeda et al. | |
| 2016/0037608 A1 | 2/2016 | Ikeda et al. | |
| 2016/0044751 A1 | 2/2016 | Ikeda et al. | |
| 2016/0103649 A1 | 4/2016 | Yoshitani et al. | |
| 2016/0132281 A1 | 5/2016 | Yamazaki et al. | |
| 2016/0155391 A1 | 6/2016 | Takesue et al. | |
| 2016/0210103 A1 | 7/2016 | Yoshizumi et al. | |
| 2016/0218305 A1* | 7/2016 | Kim | G02F 1/133305 |

* cited by examiner

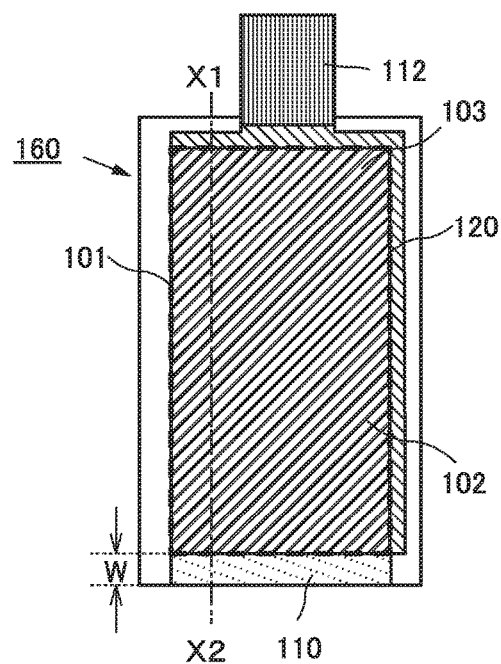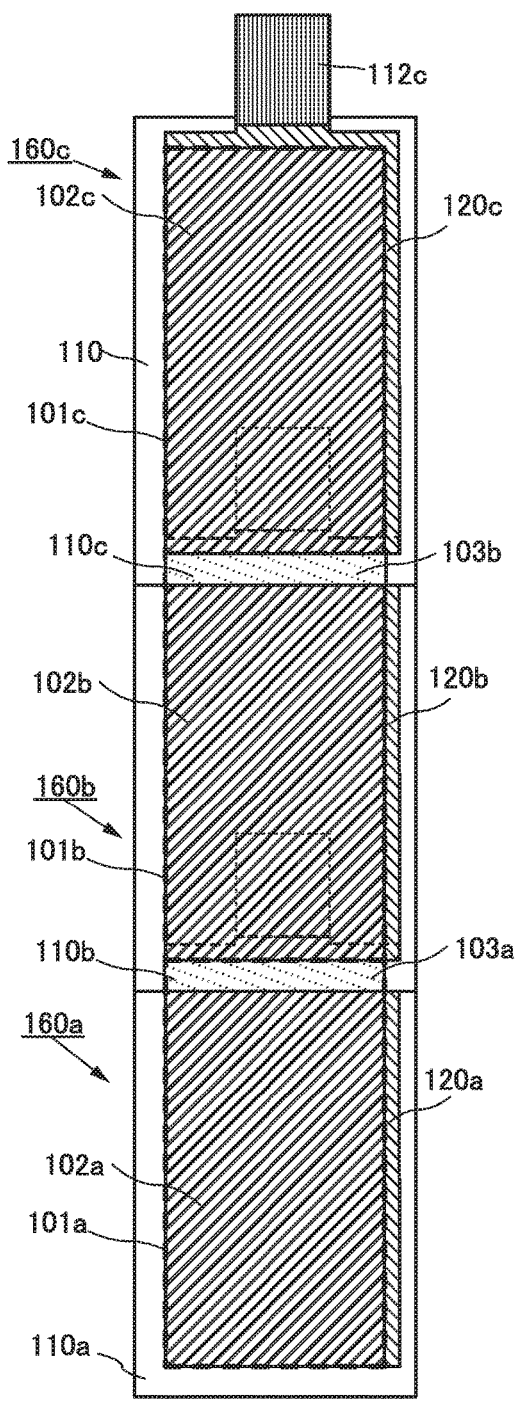

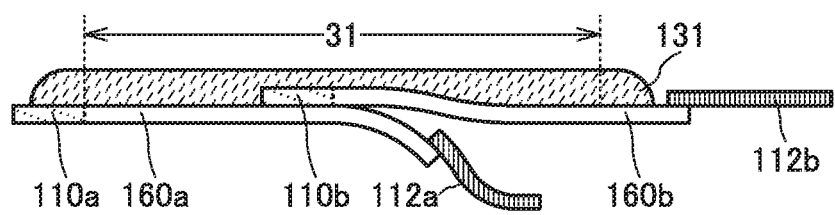
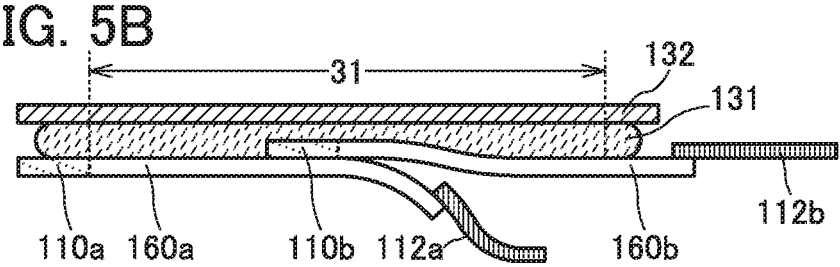
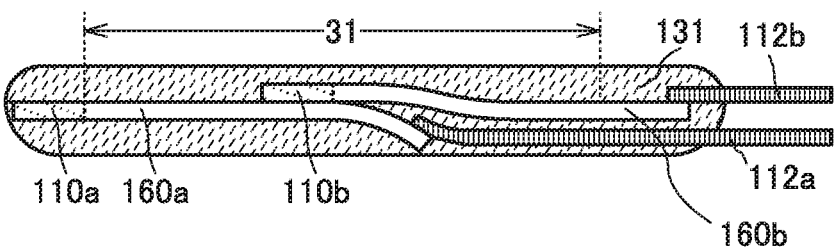

ELECTRONIC DEVICE, DISPLAY DEVICE, METHOD FOR MANUFACTURING THE SAME, AND SYSTEM INCLUDING A PLURALITY OF DISPLAY DEVICES

BACKGROUND OF THE INVENTION

1. Field of the Invention

The present invention relates to a display device, a manufacturing method thereof, and an indoor environment management system using the display device.

Note that one embodiment of the present invention is not limited to the above technical field. The technical field of one embodiment of the invention disclosed in this specification and the like relates to an object, a method, a manufacturing method, or a system. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, a method for manufacturing any of them, and a system including any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

Display devices such as liquid crystal display devices and electronic paper have been widespread and many people carry the display devices and use them for various purposes.

Furthermore, a television placed indoors is becoming thinner and with a television having such a display size that it can be hung on a wall, high-resolution display can be watched at home.

Display portions of these display devices are formed using glass substrates in many cases; accordingly, the display devices might be broken. Patent Document 1 discloses the following structure: a display device using a flexible substrate formed of a polyethylene terephthalate resin, a polyimide resin, or the like is manufactured as a display device, an electronic device, or a lighting device that is less likely to be broken, and a substrate formed using a material softer than the flexible substrate, specifically, a material having a low Young's modulus (e.g., silicone rubber or fluorine rubber) is provided in contact with the flexible substrate.

REFERENCE

Patent Document

[Patent Document 1] Japanese Published Patent Application No. 2015-062060

SUMMARY OF THE INVENTION

A display device carried around by a user is desirably compact and lightweight; accordingly, it is desirable to use a plastic film instead of a glass substrate for the display device. When the plastic film is used, the display device is less likely to be broken as compared with the case where the glass substrate is used.

In addition, since touch input is desired by the user, the display device preferably has a surface which does not cause uncomfortable feeling when the user touches the surface with his/her finger or skin.

However, when the plastic film is used for the display device, there is a disadvantage that a surface of a display portion is easy to damage. In addition, since the plastic film has a low blocking property against moisture or the like, there is another disadvantage that reliability of the display device is decreased as compared with the case where the glass substrate is used.

The display device using the plastic film can include a display portion having a curved surface.

The display device carried around by the user is desirably compact and lightweight; accordingly, a display area is reduced whether the glass substrate or the plastic film is used. When the display device is compact, power consumption related to display can be reduced. However, the display area is desirably large when the user performs touch input or watches an image on the display device. Taking these into consideration, it is difficult to meet two requirements of the user with one device.

In this specification, an object is to provide a highly reliable flexible display device which can be placed on various places such as a curved surface, a projected portion, a depressed portion, and an edge portion and to place a plurality of electronic devices which can be synchronized with the display device in a free position.

Another object is to provide an article in which a flexible display device is placed on any position. Examples of the article include furniture such as a chair, a sofa, a bed, or a drawer, an interior ornament, and kitchenware.

Another object is to provide a novel device.

Another object is to reduce manufacturing cost. In the case where a display panel is designed in accordance with the size of a display area, a manufacturing mask (e.g., a photomask) of that size needs to be prepared, thereby increasing the cost of the mask. In general, a plurality of display panels are manufactured using a large-area substrate in order to reduce the cost. However, when the display panel is manufactured for each display area, a different mask needs to be prepared even in the case where there is a slight difference in the size of each display area.

When the articles in which the flexible display device is placed on any position are placed indoors, there are a plurality of display devices with different sizes of display areas in one room, for example. It is difficult for one user to manage the plurality of display devices in consideration of the total power and consequently, it is preferable to have a management system efficiently controlling power consumption of the plurality of display devices possessed by an individual or a family. The brightness of one room is influenced by a plurality of lighting devices, light from a television, or light incident through a window; accordingly, a system that manages an indoor environment such as brightness has been desired. In particular, since brightness performance of a television is improved and a display screen of the television itself can be lighting in the room, unnecessary power might be consumed depending on the balance with luminance of indoor lighting or the like or a position of the television (a positional relationship with a lighting device or a window).

An image quality adjusting function is normally provided in a television and can be set freely by a user; however, most users only set a mode (e.g., a high image quality mode for a movie or the like or a power-saving mode) which is prepared in advance by a television manufacturer because the image quality adjustment of a high performance television is complicated. Thus, even when a television has higher image quality in the future, the television can hardly perform appropriate display in accordance with a viewing environment or preference of the user.

In a structure of a bendable electronic device or an electronic device fixed in a state of being bent, a wiring including a resin or a wiring including a metal nanoparticle is used in at least a portion that is bent when external force is applied. These wirings are formed by a printing method or a droplet discharging method (e.g., an ink-jet method).

In a display panel using a flexible film, generation of a crack caused by a change in shape, such as bending, leads to breakage of the display panel. A region where the crack is generated is a region formed of an inorganic material, such as an inorganic insulating film or a metal wiring. Since the inorganic insulating film or the metal wiring has lower elasticity compared with an organic material film, the crack is easily generated.

When the whole display panel using the flexible film has a uniform structure, any part of a display device can be bent. The display panel using the flexible film is difficult to maintain its shape; thus, the display panel is held by a structure body. For example, in the case where the display panel is held by a structure body having a curved surface, the display panel using the flexible film is also bent along the curved surface. In the case where the flexible film is fixed in a state of being bent in an electronic device, the flexible film is bent at the time of manufacturing it. In the case where the electronic device has a portion whose shape is changed by the operation of the user, only a certain portion is repeatedly bent. When a plurality of openings aligned in one direction are formed in an insulating layer over the film, the aligned openings form a crease and the portion can be easily bent along the aligned openings. When a structure in which the plurality of openings are covered with a layer of a viscoelastic high molecular material such as a silicone resin is employed, the film can be protected.

A structure of the invention disclosed in this specification is a display device including a wiring over a film, an insulating layer over the wiring, and a viscoelastic high molecular material layer over the insulating layer. The insulating layer includes an opening. A top surface and a side surface of the wiring overlapping with the opening are in contact with the high molecular material layer.

In another structure of the invention, a wiring partly including a metal nanoparticle is formed over the film. With use of the wiring partly including the metal nanoparticle, a wiring having elasticity can be obtained. The metal nanoparticle can be formed by arc melting in a hydrogen atmosphere. Examples of a metal used for the metal nanoparticle include Cu, Ag, Au, Zn, Al, Mg, Sc, Ti, Zr, V, Nb, Ta, Cr, Mo, W, Mn, Fe, Co, Ni, Pd, and Pt. In addition, an alloy containing any of these metals in combination can also be used for the metal nanoparticle.

The wiring including the metal nanoparticle is covered with an organic resin film. Furthermore, the wiring placed in a bent region may be partly exposed, and then the exposed portion may be covered with a layer of a viscoelastic high molecular material such as a silicone resin by a coating method such as an ink-jet method.

Another structure of the invention disclosed in this specification is a display device including a wiring over a film, an insulating layer over the wiring, and a viscoelastic high molecular material layer over the insulating layer. The insulating layer includes an opening. A top surface and a side surface of the wiring overlapping with the opening are in contact with a conductive layer including a metal nanoparticle. The conductive layer is in contact with the high molecular material layer.

A base insulating layer preferably has unevenness in order to make the wiring substantially longer. With such a structure, the connection break can be prevented even in the case where a display panel is greatly bent.

A display panel using a flexible film can be placed along a curved surface. A wiring including a resin or a wiring including the metal nanoparticle is used for a sharply bent portion.

In the display panel using the flexible film, the wiring including the metal nanoparticle may be changed in shape by bending the film at the opening in the insulating layer and heating the film in a state of being bent.

Furthermore, each of the above structures is an active matrix display device in which the wiring is electrically connected to a transistor provided over the film. An oxide semiconductor or a semiconductor containing a Group 14 element can be used for the transistor. A semiconductor formed with an aggregate of diamonds each having a crystal size less than 1 μm that is a kind of semiconductor containing a Group 14 element may be used for the transistor.

A plurality of panels are used for one display portion. Furthermore, the plurality of panels used for the display portion are placed along a curved surface. With use of the plurality of panels, manufacturing cost can be reduced. When two display panels partly overlap with each other, a display area can be doubled. When one display panel is treated as one unit and two panels, four panels, six panels, or nine panels are made to partly overlap with each other, one display panel can be obtained. With this structure, a display panel including a plurality of kinds of areas can be manufactured using the same manufacturing mask; thus, a reduction in cost can be achieved. That is, the manufactured display panel can be used without waste. Moreover, the almost same process can be employed and thus, yield can also be improved. In a conventional process, a mask is manufactured for each product and the products are manufactured using the masks. In contrast, in this process, display panels of a variety of products can be manufactured using only the same mask.

The display portion also functions as lighting. In application to the lighting, a passive matrix light-emitting device may be employed. In that case, the transistor is not provided over the film.

In each of the above structures, the film is fixed to a member made of a shock absorbing material.

A flexible display portion can be provided on a seat in a car that is an example of a vehicle or a component provided for a moving object such as a dashboard of a car. The seat in the car, the dashboard of the car, or the like includes the member made of the shock absorbing material. Specifically, a plurality of display panels are used for one display portion. The size of interior components varies according to a type of a car; however, the display panels are combined by changing the number of display panels in accordance with the size. The same display panels are used, so that manufacturing cost of the display portion can be reduced.

A flexible display portion can be provided on a surface, specifically, a curved surface of furniture such as a chair or a sofa. For example, when the above-described film is fixed to a backrest portion or a seating portion of a chair, an electronic device can be obtained. A chair, a sofa, or the like includes the member made of the shock absorbing material. Although it is difficult to place a display portion on a region of a chair, a sofa, or the like that is in contact with a user, the display portion disclosed in this specification can be placed on such a region.

Another structure of the invention is an electronic device including a plurality of display panels each including a film. The plurality of display panels are aligned in one direction so as to form one display screen. The films of the adjacent display panels partly overlap with each other. A portion in which the films overlap with each other has a curved surface.

Specifically, the plurality of display panels are used for one display portion. The film of the display panel is fixed to a backrest portion or a seating portion of a chair. When the plurality of display panels are in contact with a user and pushed, a space between the display panels is expanded and the display screen is divided temporarily; however, when the display panels return to its original state, the display screen returns to its original shape. That is, when the display portion is placed on the backrest portion of the chair or the sofa and the display portion is in contact with the user's back and pushed, the display portion is divided into two display portions at a joint portion; however, the divided portion can be hidden because the divided portion is in contact with the user's back. When the back is away from the display portion, the display portion returns to its original shape. Furthermore, external force can be dispersed at the joint portion, so that damage to the display portion can be reduced.

The display panel using the flexible film can be a high image quality screen, and there are other advantages as follows: the display panel is portable; the space for placement can be saved; a placement position is not limited; the screen is not broken even when the display panel is dropped because glass is not used; and a screen larger than the size of a panel manufactured using a glass substrate can be obtained. In consideration of demand for the flexible display panels belonging to individuals, the display panel shows promise as a sub-display. For example, when an information terminal such as a smartphone and the flexible display panel that can display image data received from the smartphone are used, the flexible display panel having a larger screen than the smartphone can be utilized. For example, when a stationary television is not placed but a chair including the display portion placed on a backrest portion or a sofa including the display portion placed on a backrest portion is placed indoors, the display portion and the screen of the smartphone can each be used for different purposes.

In addition, a management system that controls a plurality of devices, such as display devices including the stationary television and a plurality of lighting devices, placed indoors and manages environments thereof is provided. Accordingly, a cloud computing system (hereinafter, also referred to as a cloud) is used via Internet connection. When a user possesses a plurality of display devices, it is hard to avoid an increase in the total power consumption; however, when the plurality of display devices used for different purposes are controlled using the cloud and the power consumption is decentralized, the amount of increase in the power consumption can be reduced.

The cloud includes at least a server computer and a memory device storing a database. The number of server computer may be one or more. The database may be stored in one server computer or a plurality of server computers.

Alternatively, the plurality of devices are connected to the Internet in order to use an application program interface (API) through the web. The API is an interface for a programming provided by an operating system or middleware. Interface specifications are determined so that an application developer can utilize functions of the interface specifications.

An optical sensor is provided in a stationary television that is one of the display devices to recognize the brightness around the television in some cases; however, since an optical sensor measuring light including light emitted from the television is not provided, image quality adjustment is performed on the basis of the brightness around the television. Accordingly, a device other than the television senses the indoor brightness and the image quality adjustment is preferably performed on the basis of the brightness around a user in consideration of light emitted from the television screen, and indoor lighting adjustment is preferably also performed. Note that even if the display can be adjusted appropriately, all the settings are back to the default when a power failure occurs, and the image quality adjustment needs to be restarted from the beginning. Therefore, the image quality adjustment is preferably stored in the server computer.

When a high-performance television continues to display a high-quality image, some pixels maintain high luminance depending on the image. Accordingly, the pixels deteriorate and display quality is partly reduced, which might shorten the lifetime of the display device. When the same image is displayed on a liquid crystal display device or an organic EL display device for a long time, image persistence might be caused. In particular, since light-emitting materials used for a red-light-emitting element, a green-light-emitting element, and a blue-light-emitting element of the organic EL display device are different from one another and lifetimes thereof are also different from one another, local deterioration in pixels more easily occurs in the organic EL display device than in the liquid crystal display device. Furthermore, the red-light-emitting element, the green-light-emitting element, and the blue-light-emitting element each have a different light-emitting area in the organic EL display device in some cases. In view of these, the quality of the display portion is maintained by providing a deterioration-suppressing mode in which image data displayed on the display portion of the television is acquired at all time, the enormous amount of the acquired data is accumulated in the server computer, and image data is formed (or processed) and displayed so that local deterioration in the pixels does not occur. It is necessary to use a CPU or the like in order to form the image data; thus, the cloud or the API through the web is used. For example, when a high image quality mode is employed in displaying a drama and the deterioration-suppressing mode is employed in displaying a commercial or a news program, high quality display can be maintained for a long time. The image data in the deterioration-suppressing mode is formed using the cloud or the API through the web and delivered to the television. In the deterioration-suppressing mode, a user can rest his/her eyes and eyestrain can be reduced.

When a display device in addition to the television is placed indoors, the following control system is employed: the user watches a drama on the display portion of the television, the television is switched to the deterioration-suppressing mode when a commercial is broadcast, the commercial is displayed on another display device (e.g., a smartphone or a smart watch which has a screen smaller than the television) while the television is in the deterioration-suppressing mode, and the television is switched to the display mode when the display is switched to the drama from the commercial so that the user can watch the drama on the television again. In particular, when black display is performed in the organic EL display device, a light-emitting element in the black display portion becomes off state and thus, power consumption in the portion is reduced. Since a screen area of the smartphone is smaller than that of the television, power consumed by the smartphone is much smaller than power consumed by the television when the image of the same quality is displayed.

In the liquid crystal display device in which LED backlight is partly turned off (such a method is referred to as a local dimming technology), an LED element in the black display portion becomes off state and thus, power consumption in the portion is reduced. Note that the liquid crystal display device other than the liquid crystal display device utilizing the local dimming technology also uses the backlight, the power consumption can be reduced by turning off the backlight when the black display is performed on the whole screen. As described above, there are not only a broad classification into the liquid crystal display device and the organic EL display device but also a variety of types in the display devices in accordance with the manufacturers or products even in the display devices of the same classification, and optimum display methods or usage methods of the display devices are different from each other. Accordingly, in the plurality of display devices possessed by a user, selection of the optimum display method or usage method, formation of the optimum display data, and output of the display data to the optimum display portion are controlled by the cloud in accordance with the indoor usage environment or usage conditions, which supports power management to be performed by the user.

Since the deterioration also occurs in a lighting device and the amount of light incident through a window also affects the image display, the image data of the deterioration-suppressing mode is preferably prepared in consideration of these.

A system including a plurality of display devices and disclosed in this specification includes a lighting device having a function of controlling the amount of light from lighting, a first display device having a function of transmitting display data, and a second display device including a sensor portion acquiring the amount of light including at least light emission from a display portion of the first display device and the lighting. The second display device includes a display portion including a display area smaller than that of the first display device. The system further includes an acquiring portion acquiring display data displayed on the first display device, a predicting portion predicting deterioration in the display portion of the first display device on the basis of information on the acquired display data, a display data formation portion forming display data for suppressing the deterioration in the display portion of the first display device on the basis of data on the amount of light acquired in the sensor portion, a control portion selecting a display device to which the formed display data is output and determining the amount of light from the lighting device, and a transmitting portion transmitting the formed display data to the selected display device and transmitting a signal for change into the determined amount of light to the lighting device. At least any one of the acquiring portion, the predicting portion, the display data formation portion, the control portion, and the transmitting portion is a functional object placed in a cloud computing system.

In the above system, a portable information terminal including a sensor portion may be used as the second display device. The sensor portion having sensitivity in a visible light region with a wavelength of 400 nm to 700 nm is particularly referred to as a visible light sensor. The sensor portion has portions functioning as a photoelectric conversion element, a control portion, and an A/D converter circuit. The sensor portion has a function of sensing light. The control portion has a function of controlling the timing of the sensor portion sensing light. The A/D converter circuit has a function of converting a current or a voltage corresponding to light sensed by the sensor portion from an analog value to a digital value.

In the above system, the area of the display portion of the second display device is smaller than that of the first display device. When an image displayed on the first display device is changed to be displayed on the display portion of the second display device and operation is performed, power saving can be achieved.

In the above system, the second display device is provided in contact with furniture such as a sofa or a chair. When a flexible display device is provided in a portion having a curved surface of the sofa or the chair and the sensor portion is provided over a flexible film, light from multiple directions can be sensed. A comfortable viewing environment can be provided by adjusting the display data of the first display device or luminance of the lighting on the basis of the amount of light.

Damage to a display portion with a flexible region of an electronic device due to a change in shape that is caused by an external force applied to the electronic device can be reduced.

It is possible to provide a novel electronic device.

When a plurality of display panels manufactured using the same photomask are used for one display portion of an electronic device, manufacturing cost can be reduced.

A management system that controls a plurality of devices, such as display devices including a stationary television and a plurality of lighting devices, placed indoors and manages environments thereof using the cloud is provided. When a user possesses a plurality of display devices, it is hard to avoid an increase in the total power consumption; however, when the plurality of display devices used for different purposes are controlled using the cloud and the power consumption is decentralized, the amount of increase in the power consumption can be reduced.

BRIEF DESCRIPTION OF THE DRAWINGS

In the accompanying drawings:

FIGS. 3A and 3B are top views each illustrating one embodiment of the present invention;

FIGS. 5A to 5C are cross-sectional views each illustrating one embodiment of the present invention;

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that modes and details of the present invention can be modified in various ways. In addition, the present invention should not be construed as being limited to the description in the embodiments given below.

Embodiment 1

Figure 1A:
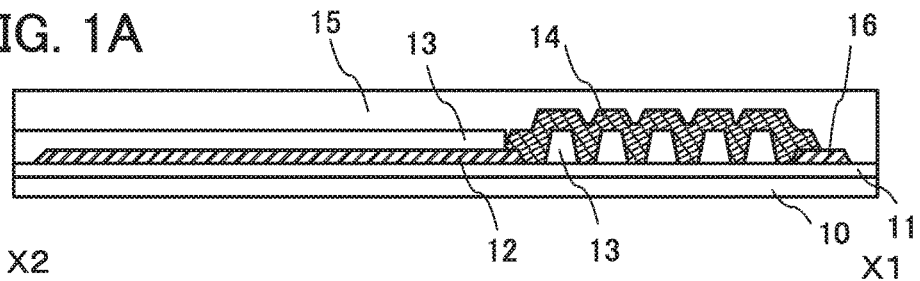
FIGS. 1A to 1C are cross-sectional views illustrating one embodiment of the present invention.

FIG. 1A illustrates an example of a simplified view of a cross-sectional structure of a display device. Note that an organic EL element that is a display element is not illustrated in FIG. 1A for simplicity. In a conventional structure, an FPC that is connected to a terminal electrode over a film is bent for storage; however, in this embodiment, a film 10 is bent. Accordingly, the structure in this embodiment is effective in the case where a display panel is placed in a housing with a limited storage space.

The display device illustrated in FIG. 1A includes an insulating layer 11, a wiring 12, an insulating layer 13, a conductive layer 14 including a metal nanoparticle, and a sealing layer 15 over the film 10. A wiring 16 is electrically connected to the wiring 12 through the conductive layer 14 including the metal nanoparticle.

In a bent portion of the display device, the wiring connection might be partly broken in the case of a sharp bend or repeated bends.

Figure 1B:
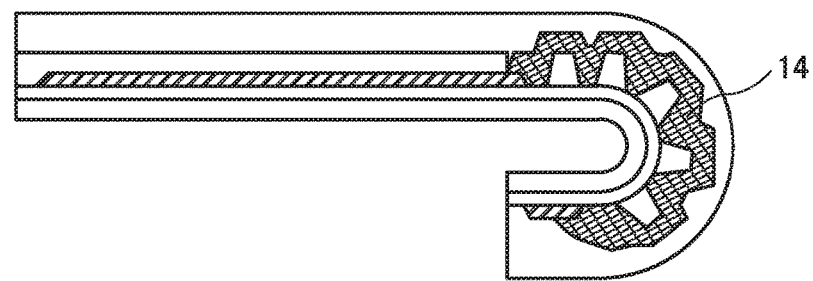

In the bent portion, part of the wiring is formed using the conductive layer 14 including the metal nanoparticle. FIG. 1B illustrates a cross-sectional view of the bend of the bent portion. As illustrated in FIG. 1B, wiring heat treatment is performed to stabilize the conductive layer 14 including the metal nanoparticle after the bend. To prevent the connection break, which is caused by force applied in a direction where the wiring is stretched when the film 10 is bent and a component over the film 10 is stretched, openings are formed in the insulating layer 13 so that the wiring becomes substantially longer by meandering in cross section. When a plurality of openings are formed and aligned, a portion that is easy to bend is formed along the line where they are aligned.

The insulating layer 11 is a barrier layer and a stack of a silicon oxide film, a silicon nitride film, and the like is used. The barrier layer prevents entry of impurities into the organic EL element.

The insulating layer 13 and the sealing layer 15 are preferably formed using an organic resin material. The sealing layer 15 also functions as the barrier layer for preventing entry of impurities into the organic EL element.

With such a structure, disconnection of the wiring can be prevented.

Figure 2A:
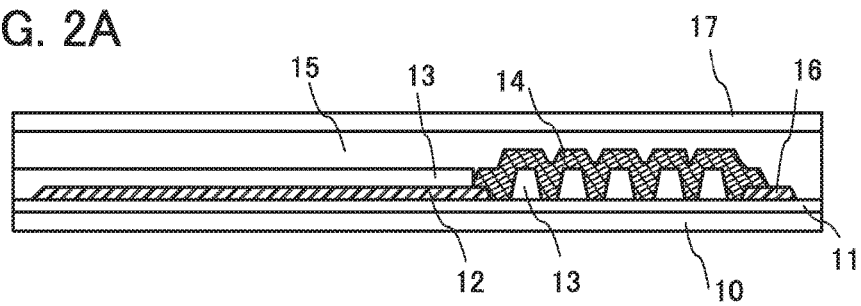
FIGS. 2A to 2C are cross-sectional views each illustrating one embodiment of the present invention.

FIG. 2A is an example in which a film 17 is provided on the opposite side of the film 10. Not only the film 17 for sealing, but also an optical film (a circularly polarizing plate or a color film) may be further provided. In addition, a touch input panel may be provided.

Figure 2B:
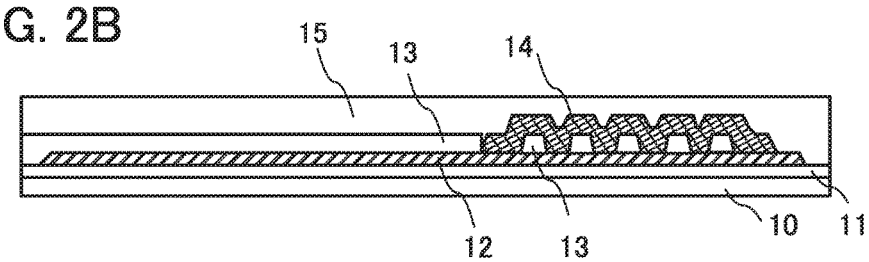

FIG. 1A illustrates an example in which the wiring at the bent portion is removed by etching and electrical connection is made with the conductive layer 14 including the metal nanoparticle; however, there is no particular limitation, and the conductive layer 14 including the metal nanoparticle may be formed so as to overlap with the wiring at the bent portion as illustrated in FIG. 2B.

Figure 2C:
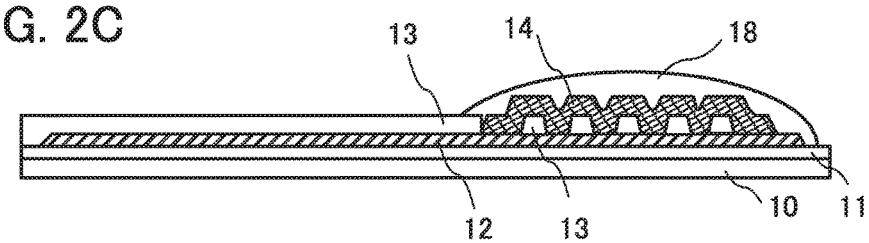

In FIG. 2C, a material layer 18 having a low Young's modulus is used to give further flexibility to the bent portion of the display device. Specifically, a viscoelastic high molecular material such as silicone rubber or fluorine rubber is used.

Figure 1C:
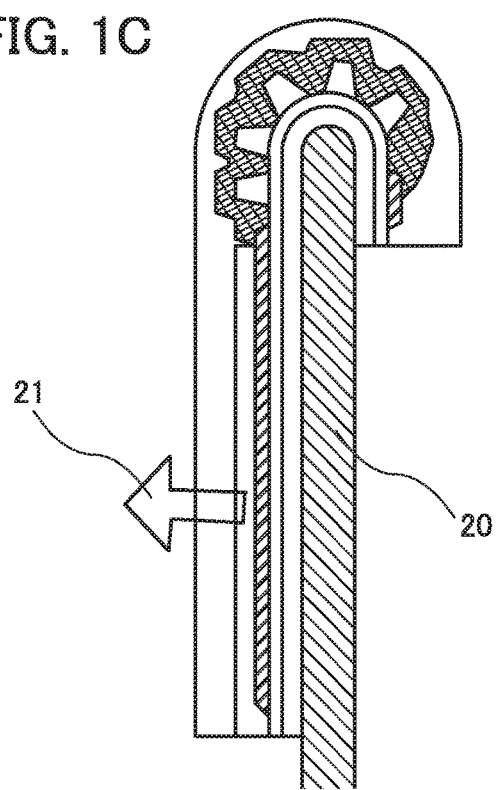

FIG. 1C is a cross-sectional view illustrating the positional relationship between the display device and a structure body 20. FIG. 1C shows an example in which the display device is fitted to and fixed to the thin structure body 20. As illustrated in FIG. 1C, the display device itself is held by the structure body 20. An arrow 21 in the drawing indicates the direction in which light is emitted from the organic EL element. FIG. 1C illustrates an example in which a display portion is not bent but a peripheral portion is bent. In the case where the structure body 20 is a backrest portion of a chair, the structure body 20 is bent when the user leans against the backrest portion; accordingly, the display portion is also bent gently.

FIG. 3A is a schematic top view of a display panel 160. A cross-sectional view taken along the chain line X1-X2 corresponds to FIG. 1A.

The display panel 160 includes a display region 101, and a region 110 transmitting visible light and a region 120 having a portion blocking visible light that are adjacent to the display region 101. FIG. 3A illustrates an example in which the display panel 160 is provided with a flexible printed circuit (FPC) 112.

The display region 101 includes a first region 102 and a second region 103. The display region 101 includes a plurality of pixels arranged in matrix and can display an image. One or more display elements are provided in each pixel. Typical examples of the display element include a liquid crystal element and a light-emitting element such as an organic EL element.

In the region 110, for example, a pair of substrates included in the display panel 160, a sealant for sealing the display element interposed between the pair of substrates, and the like may be provided. Here, for members provided in the region 110, materials that transmit visible light are used.

In the region 120, for example, a wiring electrically connected to the pixels included in the display region 101 is provided. In addition to the wiring, driver circuits (such as a scan line driver circuit and a signal line driver circuit) for driving the pixels and a circuit such as a protective circuit may be provided. Furthermore, the region 120 includes a region where a terminal electrically connected to the FPC 112 (also referred to as a connection terminal), a wiring electrically connected to the terminal, and the like are provided.

Formation of an opening in an insulating layer in the region 120 facilitates a bend. The conductive layer 14 including the metal nanoparticle illustrated in FIG. 1A is used as part of a wiring placed in the region 120.

FIG. 1C illustrates an example in which one display panel 160 is bent; however, there is no particular limitation, and one screen may be formed using a plurality of display panels and placed on the structure body by being bent. For example, FIG. 3B is a schematic top view showing the case where three display modules are used.

Hereinafter, to distinguish the display panels from each other, the same components included in the display panels from each other, or the same components relating to the display panels from each other, letters are added to reference numerals of them. Unless otherwise specified, in a plurality of display panels partly overlapping with each other, "a" is added to reference numerals for a display panel placed on the lowest side (the side opposite to the display surface side), components thereof, and the like, and to one or more display panels placed on the upper side of the display panel, components thereof, and the like, "b" or letters after "b" in alphabetical order are added from the lower side. Furthermore, unless otherwise specified, in describing a structure in which a plurality of display panels is included, letters are not added when a common part of the display panels, the components, or the like is described.

The display device illustrated in FIG. 3B includes a display panel 160a, a display panel 160b, and a display panel 160c. Furthermore, display regions 101a to 101c, regions 110a to 110c, regions 120a to 120c, first regions 102a to 102c, second regions 103a and 103b, an FPC 112c, and the like are illustrated in FIG. 3B.

The display panel 160b is placed so that part of the display panel 160b overlaps an upper side (a display surface side) of the display panel 160a. Specifically, the display panel 160b is placed so that the region 110b transmitting visible light of the display panel 160b overlaps the second region 103a in the display region 101a of the display panel 160a, and the display region 101a of the display panel 160a and the region 120b blocking visible light of the display panel 160b do not overlap each other.

Furthermore, the display panel 160c is placed so that part of the display panel 160c overlaps an upper side (a display surface side) of the display panel 160b. Specifically, the display panel 160c is placed so that the region 110c transmitting visible light of the display panel 160c overlaps the second region 103b in the display region 101b of the display panel 160b, and the display region 101b of the display panel 160b and the region 120c blocking visible light of the display panel 160c do not overlap each other.

The region 110b transmitting visible light overlaps the second region 103a of the display region 101a; thus, the whole display region 101a can be visually recognized from the display surface side. Similarly, the region 110c overlaps the second region 103b of the display region 101b; thus, the whole display region 101b can be visually recognized from the display surface side. Therefore, a region where the display region 101a, the display region 101b, and the display region 101c are placed seamlessly can serve as a display region.

Here, the width W of the region 110 in FIG. 3A is greater than or equal to 0.1 mm and less than or equal to 200 mm, preferably greater than or equal to 0.5 mm and less than or equal to 150 mm, further preferably greater than or equal to 1 mm and less than or equal to 100 mm, still further preferably greater than or equal to 2 mm and less than or equal to 50 mm. The region 110 serves as a sealing region, and as the width W of the region 110 is larger, the distance between an end surface of the display panel 160 and the display region 101 can become longer, so that entry of impurities such as water into the display region 101 from the outside can be effectively suppressed.

In particular, in this structure example, the region 110 is provided adjacent to the display region 101; thus, it is important to set the width W of the region 110 at an appropriate value. For example, in the case where the organic EL element is used as the display element or the case where a transistor (in particular, a transistor including an oxide semiconductor) is used in a pixel, the width W of the region 110 is set to be greater than or equal to 1 mm, whereby deterioration of the organic EL element or the transistor can be effectively suppressed; thus, reliability can be increased. An oxide semiconductor has a bandgap of 3.0 eV or higher; thus, leakage current due to thermal excitation of a transistor whose active layer or active region contains an oxide semiconductor (hereinafter referred to as an OS transistor) is low and the off-state current of the transistor is extremely low. A channel formation region of an OS transistor is preferably formed using an oxide semiconductor containing at least one of indium (In) and zinc (Zn). Examples of the oxide semiconductor include an In—Ga oxide and an In-M-Zn oxide (M is aluminum (Al), gallium (Ga), yttrium (Y), zirconium (Zr), lanthanum (La), cerium (Ce), tin (Sn), hafnium (Hf), or neodymium (Nd)). Note that the semiconductor is not limited to the oxide semiconductor and a transistor in which a semiconductor containing a Group 14 element is used for a semiconductor film can be used. Specifically, a semiconductor containing silicon or a semiconductor containing carbon can be used for the semiconductor film. For example, single crystal silicon, polysilicon, microcrystalline silicon, or amorphous silicon can be used for the semiconductor film of the transistor. For example, a semiconductor formed with an aggregate of diamonds each having a crystal size less than 1 µm can be used for the semiconductor film. When a microcrystalline diamond thin film is formed over a light-transmitting substrate with a microwave CVD apparatus using an argon gas, a methane gas, and a hydrogen gas as material gases and doped with an n-type impurity element such as phosphorus, an n-type semiconductor is obtained. When the microcrystalline diamond thin film is doped with a p-type impurity element such as boron, lithium, or hydrogen, a p-type semiconductor is obtained. The field-effect mobility of a transistor using the microcrystalline diamond thin film is high and thus, a channel size can be reduced. Accordingly, even when the transistor is transferred to a flexible film and the flexible film is bent, there is an advantage that electrical characteristics of the transistor are hardly adversely affected. Note that also in a part other than the region 110, the distance between an end portion of the display region 101 and the end surface of the display panel 160 is preferably in the above range.

In FIG. 3B, all the three display panels 160 are the same. In this case, the second region 103 in which an aperture ratio is high is visually recognized in the display panel 160c placed on the uppermost side. Therefore, when an image or the like is displayed on the display region of the display device, part of the display region has high luminance in some cases.

To prevent this, the luminance of the second region 103 is preferably reduced in the case where the second region 103 in which an aperture ratio is high is not overlapped by the region 110 of another display panel 160. For example, a light-transmitting member whose transmittance is the same as that of the region 110 can be placed to overlap the display surface side of the second region 103. At this time, the light-transmitting member may have a film-like shape or a plate-like shape. As the light-transmitting member, it is preferable to use a member obtained in the following manner, for example: in manufacturing the display panel 160, a member having a stacked-layer structure similar to that of the region 110 is formed over the same substrate through a similar process and separated.

Alternatively, image processing for correcting the gray level of an image to be displayed may be performed only on the second region 103 to reduce the luminance of the second region 103. The maximum luminance of the second region 103 is higher than the maximum luminance of the first region 102. Therefore, image processing for lowering the gray level can correct the gray level so that the first region 102 and the second region 103 can have the same luminance.

Alternatively, for example, a member having a light-blocking property is provided to overlap with the second region 103 so that an image displayed on the second region 103 is not visually recognized, or an image is not displayed on the second region 103. Thus, the second region 103 in the display panel 160 closest to the display surface side may be excluded from the display region of the display device.

Although the plurality of display panels are aligned in one direction in the above description, a plurality of display panels may be aligned in both longitudinal and lateral directions.

Figure 4:
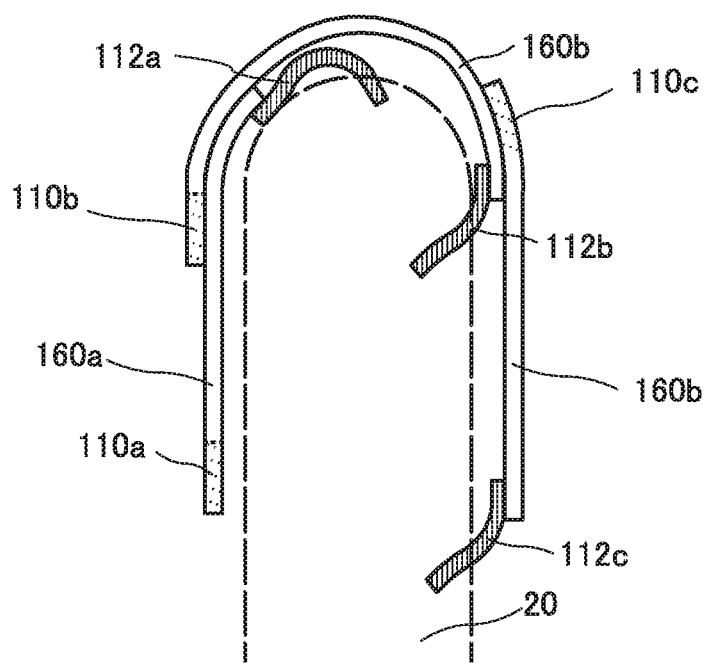
FIG. 4 is a cross-sectional view illustrating one embodiment of the present invention.

A case where the three display panels are placed in a bent portion or a bendable portion of an electronic device is described below. FIG. 4 illustrates an example in which the display panels are placed along the structure body 20 having a curved surface. In the case where the plurality of display panels are used, the FPCs are pulled into the structure body as illustrated in FIG. 4. Although not shown here, as a driver circuit forming a video signal for the FPCs or the like, a driver circuit, a power supply circuit, a wireless communication circuit, and the like are provided inside the structure body or to be connected through a wiring placed inside the structure body.

A material having elasticity to some extent such as a wiring using the metal nanoparticle is used in the bent portion or the bendable portion of the electronic device.

Alternatively, a wiring structure in which the wiring is meandered in cross section is employed. The meandering can hinder external tension from breaking the wiring connection. The wiring does not necessarily meander in cross section and may meander when seen from the above. Furthermore, the wiring may also function as an antenna by utilizing the meandering pattern.

The wiring including the metal nanoparticle is surrounded by an organic resin. A stacked-layer structure of a metal layer obtained by a sputtering method and a layer including the metal nanoparticle may be employed.

FIG. 5A is a schematic cross-sectional view when the two display panels 160 are bonded to each other. FIG. 5A illustrates an example in which an FPC 112a and an FPC 112b are connected to the display surface side of the display panel 160a and the display surface side of the display panel 160b, respectively. A light-transmitting resin layer 131 is provided to cover the top surfaces of the display panels 160a and 160b. The light-transmitting resin layer 131 may be formed using a viscoelastic high molecular material. As illustrated in FIG. 5A, one display region 31 includes two display panels 160a and 160b and seams are made inconspicuous.

Alternatively, as illustrated in FIG. 5B, a protective substrate 132 is preferably provided over the display device with the resin layer 131 provided therebetween. Here, the resin layer 131 may serve as a bonding layer for bonding the protective substrate 132 to the display device. With the protective substrate 132, the surface of the display device can be protected, and moreover, the mechanical strength of the display device can be increased. For the protective substrate 132, a light-transmitting material is used at least in a region overlapping with the display region 31. Furthermore, the protective substrate 132 in a region other than the region overlapping with the display region 31 may have a light-blocking property not to be visually recognized.

The protective substrate 132 may function as a touch panel. In the case where the display panel 160 is flexible and can be bent, the protective substrate 132 is also preferably flexible.

Furthermore, a difference in refractive index between the protective substrate 132 and the substrate on the display surface side of the display panel 160 or the resin layer 131 is preferably less than or equal to 20%, further preferably less than or equal to 10%, still further preferably less than or equal to 5%.

As the protective substrate 132, a plastic substrate that is formed as a film, for example, a plastic substrate made from polyimide (PI), an aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, and the like can be used. The protective substrate 132 is preferably flexible. The protective substrate 132 includes a fiber or the like (e.g., a prepreg). Furthermore, a base is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

Alternatively, as illustrated in FIG. 5C, the resin layer 131 may also be provided on surfaces opposite to the display surfaces of the display panels 160a and 160b. This structure can be manufactured in the following manner: the display panels 160a and 160b are put in a mold in a state where they overlap with each other and the viscoelastic high molecular material is poured into the mold and cured.

This embodiment can be implemented in appropriate combination with any of the structures described in the other embodiments.

Embodiment 2

Figure 6A:
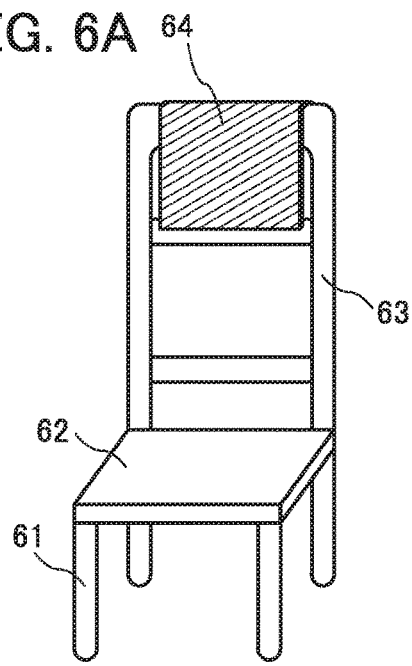
FIGS. 6A to 6C are a perspective view and cross-sectional views each illustrating one embodiment of the present invention.
Figure 6B:
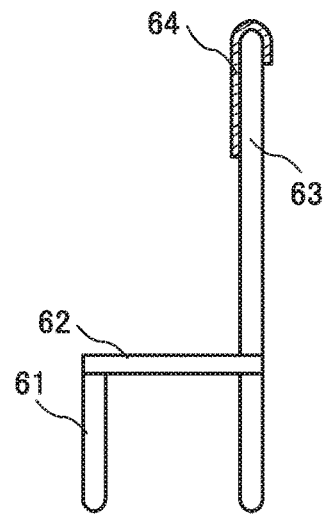
Figure 6C:
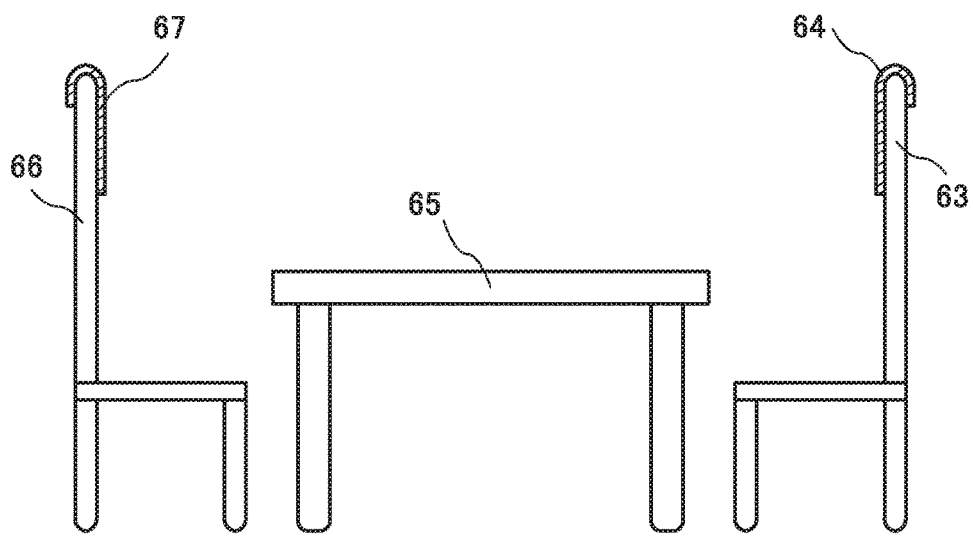

FIGS. 6A to 6C illustrate an example in which a chair as an example of furniture is provided with a display portion. In the display portion, one display panel 160 or the plurality of display panels 160a to 160c described in Embodiment 1 is used.

FIG. 6A illustrates an example of a perspective view of the chair. The chair includes leg portions 61, a seating portion 62, and a backrest portion 63. The backrest portion includes a display device 64. FIG. 6B illustrates a cross-sectional view of the chair.

The display device 64 is placed on the backrest portion 63 of the chair.

In the case where one display panel 160 is used for the display device 64, a portion corresponding to an uppermost part of the backrest portion does not display an image. The structure body 20 illustrated in FIG. 1C corresponds to the backrest portion 63 and FIG. 1C corresponds to a cross-sectional view of the display device 64.

In the case where the plurality of display panels 160a to 160c partly overlapping with each other are used for the display device 64, the plurality of display panels are aligned in the height direction of the backrest portion 63 so that one image can be displayed on the display device 64. In this case, the structure body 20 illustrated in FIG. 4 corresponds to the backrest portion 63 and FIG. 4 corresponds to a cross-sectional view of the display device 64.

The backrest portion 63 of the chair may be provided with a shock absorbing material. In that case, the display device 64 is pushed by user's back through the shock absorbing material. Even when the display device 64 is pushed by the user's back, there is no problem in use because the display device 64 includes a display panel using a flexible film.

When the backrest portion of the chair includes the display device 64, a driver circuit or a power supply device is preferably placed in consideration of weight balance of the chair and is preferably placed in a bottom surface portion of the seating portion 62 or the leg portion. In the case where image data displayed on the display device 64 is not simple data, a CPU for generating the image data, another signal generating circuit, or the like is needed and accordingly, the total weight of the chair might be increased. In such a case, a weight reduction can be achieved by utilizing a web application program interface (API). The term web API means an API through a web browser. An API is a set of rules establishing procedures in a program for using a set of instructions or functions. When the chair is provided with an interface device or a circuit (e.g., a signal receiving circuit or a signal transmitting circuit) or the like for communication with an external server, access to and web application execution by the external server are possible, and the result can be used. For example, the image data to be displayed on the display device 64 is formed in the server on the basis of environmental information acquired from a sensor or the like which is provided on the chair and the formed image data can be received to be displayed.

Unlike a cathode-ray tube television, a large screen television is becoming thinner and being capable of being placed on a wall of a room. It is becoming common to place a wall-hanging television or a portable television on a table or in a kitchen. However, even when a television becomes thinner, a stage that keeps a television from falling is still large; accordingly, a large space is required. Furthermore, even when a television becomes thinner, putting something thereon is difficult; accordingly, an upper space becomes a dead space. In order to use the upper space, there is a shelf that can store a thin television; however, every time a new television is purchased, the shelf also needs to be replaced.

In view of this, a sofa or a chair placed in a room can be used as the display portion, which allows space to be used effectively particularly when the room is small. The display portion can also be provided on a chair that can be stored in a folded state. In that case, the display portion can be watched in a folded state or in an unfolded state, which is convenient for carrying. Furthermore, a moving portion such as a caster may be provided on leg portions of the sofa or the chair to facilitate movement.

FIG. 6C is a cross-sectional view illustrating two chairs on either side of a table 65 as an application example. One of the chairs includes the display device 64 and the other of the chairs also includes a backrest portion 66 provided with a display portion 67.

As illustrated in FIG. 6C, the two chairs each including the display device are arranged so as to face each other. By such arrangement, when a user sits on one of the chairs, the user can watch a display screen of the other of the chairs.

Moreover, with an optical sensor or the like provided on each of the chairs, display can be turned off when the user sits on one of the chairs. As the optical sensor, a photoelectric conversion element is used. For example, the photoelectric conversion element including a selenium-based material has high external quantum efficiency for visible light. The use of the photoelectric conversion element can achieve a highly sensitive sensor in which the amplification of electrons with respect to the amount of incident light is large owing to an avalanche phenomenon. Furthermore, the selenium-based material has a high light-absorption coefficient, making a photoelectric conversion layer thin easily. Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to and a higher absorption coefficient for visible light than amorphous selenium.

The same applies to a car, which includes a television screen in a limited position, when a back seat can be used as the display portion. For example, when the back seats are arranged so as to face each other, a user sitting on one of the back seats can watch the display portion on the other.

Figure 7:
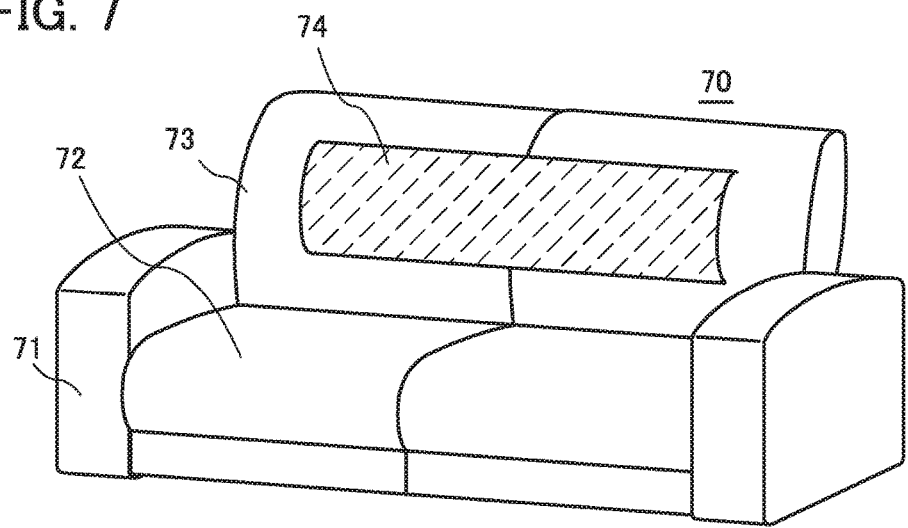
FIG. 7 is a perspective view illustrating one embodiment of the present invention.

Although FIG. 6A illustrates an example of the chair, FIG. 7 illustrates an example in which a sofa includes a display device.

FIG. 7 illustrates an example of a perspective view of a sofa 70. The sofa 70 includes leg portions 71, a seating portion 72, and a backrest portion 73. The backrest portion 73 includes a display device 74.

The display device 74 is placed on the backrest portion 73 of the sofa. A plurality of display panels are aligned in the width direction of the backrest portion 73 so that one image can be displayed on the display device 74. Furthermore, part of an image of an information terminal used by a user can be displayed on the display device provided on the sofa. For example, since an image of a movie with subtitles, which is watched by a user indoors, might be hindered by the subtitles displayed large, it is convenient arranging and synchronizing a television with a sofa so that the television is playing the movie while the sofa is displaying only the enlarged subtitles. In this manner, a display portion provided on the sofa can be used as a sub-display of another display device.

Moreover, in the case where a curved surface portion of the sofa 70 is provided with an optical sensor or the like, display can be turned off when the user sits on the sofa. In addition, the optical sensor provided in the periphery of the sofa can check whether someone is sitting on the sofa or the like. This system can be utilized to turn on a television or an air conditioner only by sitting on the sofa. When the television is provided with a motion sensor, a camera, or the like, a user can also perform channel change or volume control with gestures while sitting on the sofa. When a state where the user stands up from the sofa can be sensed, a screen can display a screen saver.

Although an example in which the backrest portion 73 includes the display device 74 is shown here, there is no particular limitation on the place and the seating portion 72 can include the display device.

The display device 74 may be directly sewn on the backrest portion 73 of the sofa. Alternatively, the display device 74 may be attached to the backrest portion 73 of the sofa with an adhesive. Alternatively, the display device 74 may be detachable from the backrest portion 73 of the sofa with a tape.

The backrest portion of the sofa is provided with a shock absorbing material and the display device can be pushed by user's back through the shock absorbing material.

In the case where three display panels are used for one display portion and are not fixed, a cushion or the sofa whose shape is changed when a user sits down returns to its original shape when the user stands up.

A flexible display panel has resistance to an impact when pushed in one direction, that is, the direction perpendicular to the plane of the panel. However, the resistance to an impact in the direction in which the panel is slid is poor. Thus, a film having a low coefficient of friction $\mu$ is preferably used as a surface.

Since a contact surface between objects having high surface accuracy is in a vacuum state, the objects are attached to each other and rendered unmovable. Large surface roughness makes the surfaces in point contact to reduce the coefficient of friction but adversely affects display.

In the case where the backrest portion or the seating portion of the sofa or the chair is provided with the display portion as illustrated in FIGS. 6A to 6C and FIG. 7, a glass substrate might be broken when used as a substrate of the display portion. When a plastic film is used as the substrate of the display portion, even in the display device provided between a cushion and the human body, elasticity can be obtained to some extent and reliability can be ensured such that a breakdown is not caused even when wrinkles are formed. For example, if capable of being changed in shape in accordance with a change in shape of the cushion caused by a seated person, the display portion has wrinkles while the person is seated and the display portion can return to its original shape when the person stands up.

In order that the display device is formed in accordance with the surface shape of the cushion while the shape or the like of the cushion is maintained in terms of design, the same material as the surface of the cushion may be used for one of the substrates. Since it is difficult to manufacture the cushion and the display device with the same manufacturing apparatus or in the same factory, a manufacturing process in which the cushion and the display device are combined after the formation of the cushion is employed. Furthermore, there might be a difference in the shape of cushions. When a margin portion of the outside of the display portion is large so as to deal with the difference, the outside of the display portion can be cut with scissors or a cutter after the attachment, which is another advantage of the plastic film.

Furthermore, an element generates no little heat when a current is supplied. Since the plastic film is a material in which the degree of elasticity is changeable by heat, heat generated from the display portion when a display element is driven is preferably released. In view of this, a heat dissipation sheet is preferably provided in contact with a film of the display device. For example, a heat dissipation silicone rubber sheet whose thermal conductivity is higher than or equal to 1.2 W/m·K and lower than or equal to 5 W/m·K is used. The heat dissipation silicone rubber sheet is thin and bendable.

In a standby screen in which an image is not displayed on the display portion of the sofa, part of the color of the sofa can be changed according to the season. In a hot summer season, the entire screen of the display portion can be changed into blue to create a cool atmosphere. In a cold winter season, the entire screen of the display portion can be changed into orange to create a warm atmosphere. Needless to say, the display screen of the display device of the sofa can be changed into a favorite color of a user.

This embodiment can be freely combined with Embodiment 1.

Embodiment 3

In this embodiment, an example in which the display panel described in Embodiment 1 is provided in part of an interior of a vehicle is described.

Figure 8A:
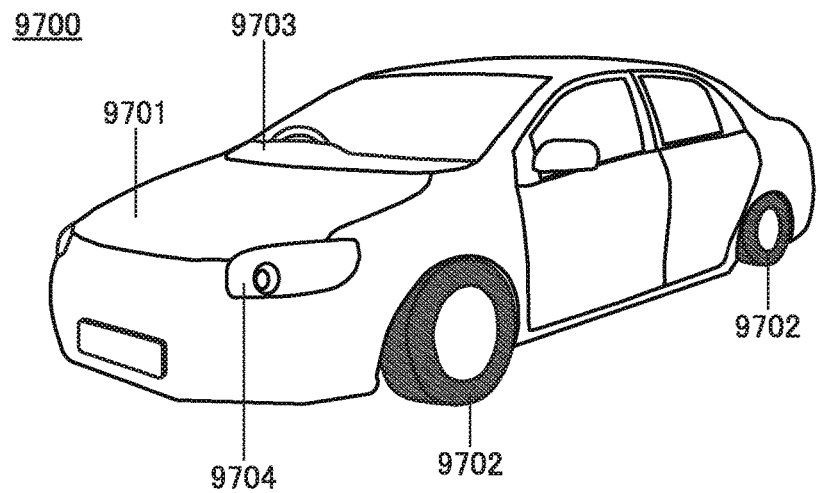
FIGS. 8A and 8B illustrate an example of an electronic device.
Figure 8B:
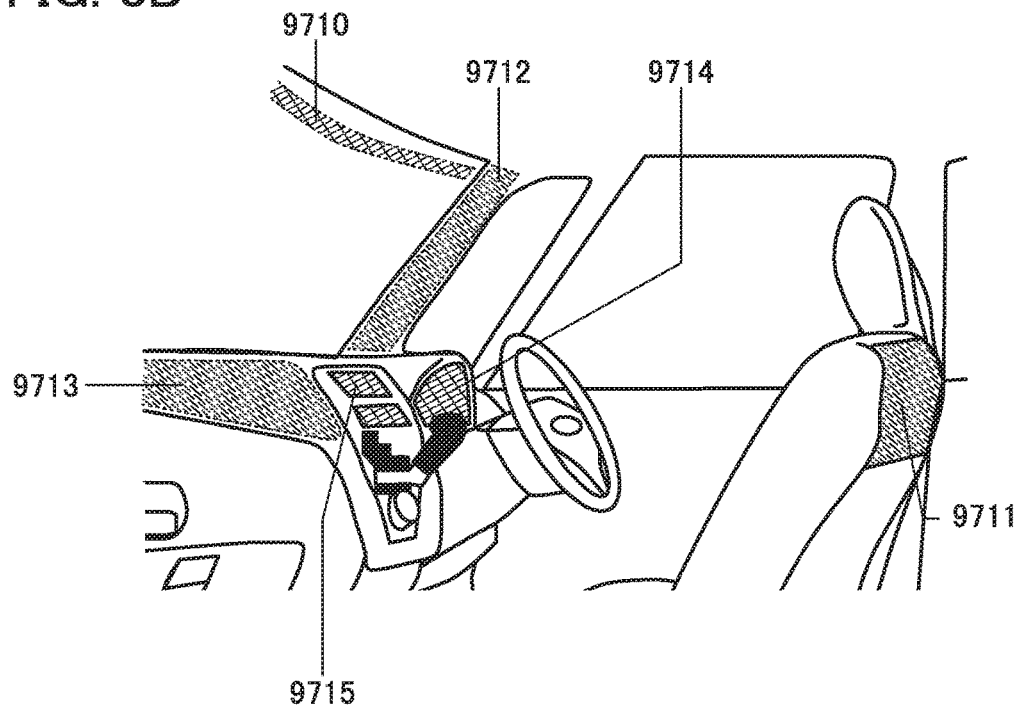

FIG. 8A is an external view of an automobile 9700. FIG. 8B illustrates a driver's seat of the automobile 9700. The automobile 9700 includes a car body 9701, wheels 9702, a dashboard 9703, lights 9704, and the like. The display device of one embodiment of the present invention can be used in a display portion or the like of the automobile 9700. For example, the display device of one embodiment of the present invention can be provided in display portions 9710 to 9715 illustrated in FIG. 8B.

The display portion 9710 is a display device provided in an automobile windshield. In the display portion 9710, a plurality of display panels are aligned and used as one display device. The display portion 9710 can also be used as lighting in the car.

The display portion 9711 is a display device provided on a backrest portion of a seat. Also in the display portion 9711, a plurality of display panels are aligned and used as one display device.

The display portion 9712 is a display device provided on a pillar portion. For example, the display portion 9712 can compensate for the view hindered by the pillar portion by showing an image taken by an imaging unit provided on the car body. The display portion 9713 is a display device provided on the dashboard. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 9:
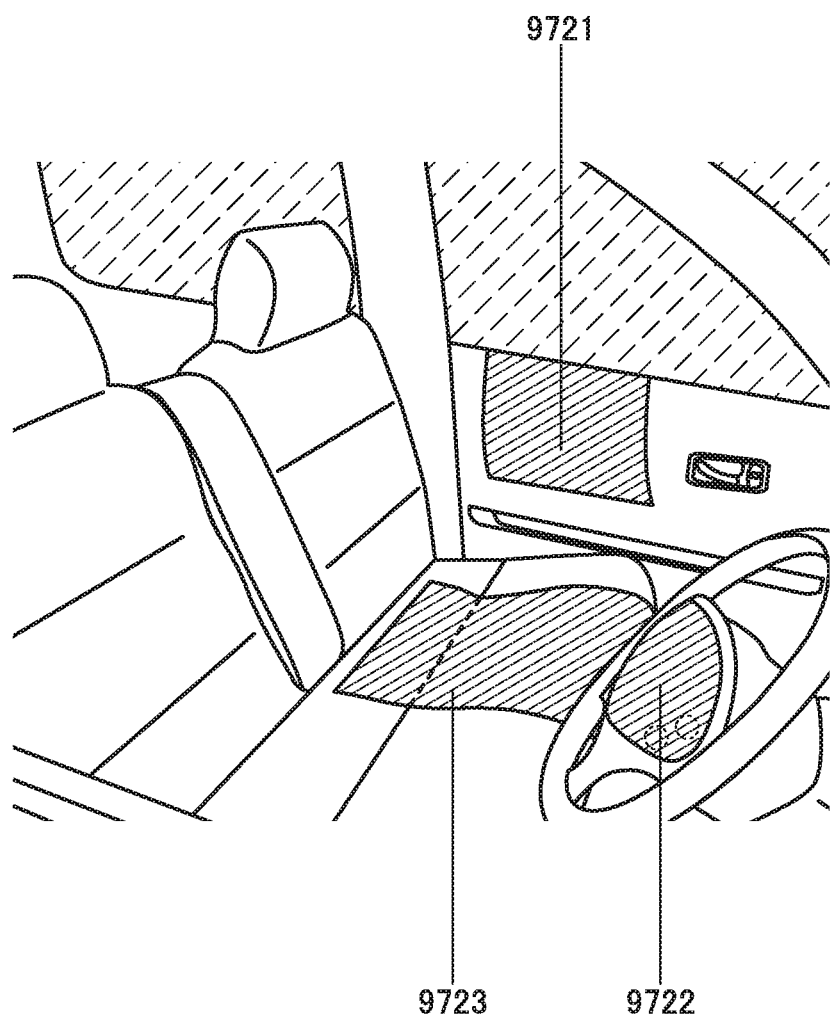
FIG. 9 illustrates an example of an electronic device.

FIG. 9 illustrates the inside of a car in which a bench seat is used as a driver seat and a front passenger seat. A display portion 9721 is a display device provided in a door portion. For example, the display portion 9721 can compensate for the view hindered by the door portion by showing an image taken by an imaging unit provided on the car body. The bent portion of the display panel which is described in Embodiment 1 is placed in a space between a window and a door, so that the display portion 9721 can be provided without changing the basic frame of the door. A display portion 9722 is a display device provided in a steering wheel. Since there are limitations on the area of a screen that can be provided on the steering wheel portion, the display panel described in Embodiment 1 is used and bent at an opening portion so that the display region can be utilized to maximum. Consequently, the area other than the display region of the display panel can be reduced and the display portion can be included in the steering wheel portion. A display portion 9723 is a display device provided in a seating portion of the bench seat. Note that the display device can be used as a seat heater using heat generation of the display device as a heat source by being provided on the seating portion, a contact surface between the backrest portion and the user's back, or the like.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

When the display region is placed in a car, the screen size varies according to the position. The screen size can be determined when a plurality of display panels manufactured using the same photomask are prepared in accordance with the area to overlap with each other, so that the manufacturing cost can be reduced.

The display device and another sensor can be used in combination. For example, in the case where whether a driver is seated in a car is checked, it is difficult to sense light in a dark place with little light and to check the sitting state with an optical sensor; accordingly, a malfunction is caused. When the backrest portion or the seating portion is provided with the display portion, the display portion is made to emit light as lighting so that an image of the shadow of the driver can be taken by the optical sensor. An accurate sitting position can also be checked using the display portion.

The display device can also be provided in a seat of an airplane, a train, and the like in addition to a car.

For example, when a passenger leaves his/her seat temporarily in a non-reserved seat of a bullet train or the like, it is difficult to secure the seat without putting baggage on the seat. However, valuables that might be stolen cannot be left in the baggage. With a portable information terminal, information can be input to the display device provided on the seating portion or the backrest portion in order to inform another passenger who is trying to sit on the seat that the seat is occupied, which allows the passenger to leave his/her seat temporarily for a limited short time. The display device can similarly be used for a seat in an amusement facility such as a movie theater or a pachinko hall.

This embodiment can be implemented in appropriate combination with any of the structures described in the other embodiments.

Embodiment 4

In this embodiment, examples of an electronic device and a lighting device including the display device of one embodiment of the present invention will be described with reference to drawings.

As examples of electronic devices including a display device with flexibility, the following can be given: television devices (also referred to as televisions or television receivers), monitors of computers or the like, cameras such as digital cameras and digital video cameras, digital photo frames, mobile phones (also referred to as cellular phones or mobile phone devices), portable game machines, portable information terminals, audio reproducing devices, and large game machines such as pachinko machines.

In addition, a lighting device or a display device can be incorporated along a curved inside/outside wall surface of a house or a building or a curved interior/exterior surface of a car.

Figure 10A:
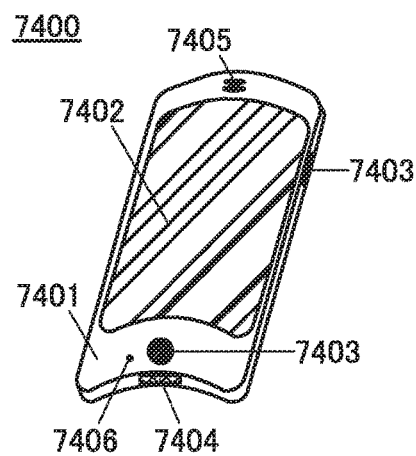
FIGS. 10A to 10E illustrate examples of electronic devices and lighting devices.

FIG. 10A illustrates an example of a mobile phone. A mobile phone 7400 is provided with a display portion 7402 incorporated in a housing 7401, operation buttons 7403, an external connection port 7404, a speaker 7405, a microphone 7406, and the like. The mobile phone 7400 is manufactured using the display device for the display portion 7402.

When the display portion 7402 of the mobile phone 7400 in FIG. 10A is touched with a finger or the like, data can be input to the mobile phone 7400. Operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device of one embodiment of the present invention. In this embodiment, part of the display panel described in Embodiment 2 is bent and stored inside the mobile phone. Thus, the mobile phone can have a curved display portion and high reliability.

Figure 10B:
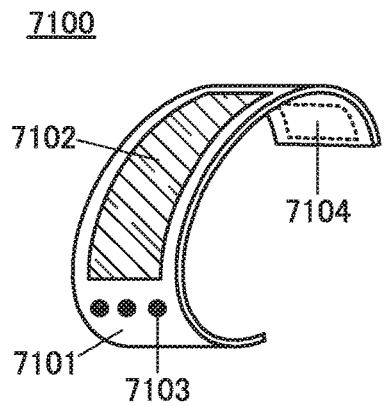

FIG. 10B illustrates an example of a wristband-type display device. A portable display device 7100 includes a housing 7101, a display portion 7102, operation buttons 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation buttons 7103, power ON/OFF, switching displayed videos, adjusting volume, and the like can be performed.

Here, the display portion 7102 includes the display device of one embodiment of the present invention. Thus, the portable display device can have a curved display portion and high reliability.

Figure 10C:
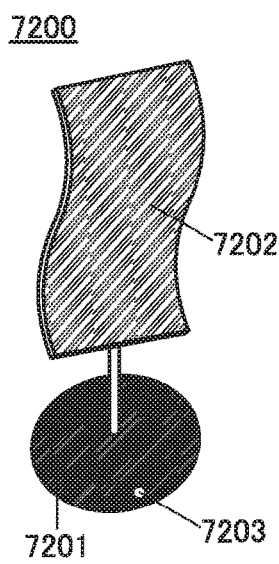
Figure 10D:
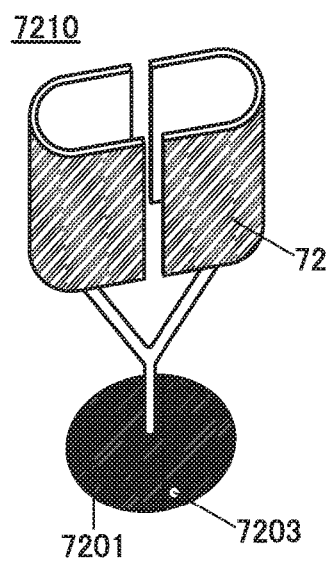
Figure 10E:
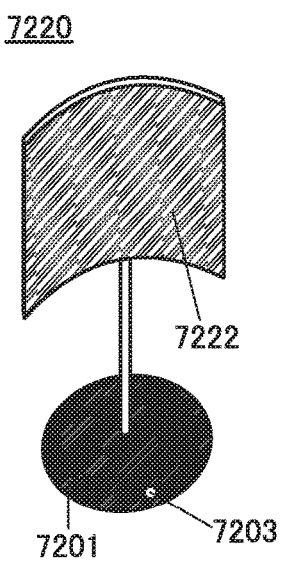

FIGS. 10C to 10E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 10C includes a light-emitting portion 7202 with a wave-shaped light-emitting surface, and thus is a good-design lighting device. Furthermore, both surfaces between which a structure body is interposed are light-emitting surfaces and the structure described in Embodiment 2 is employed.

A light-emitting portion 7212 included in the lighting device 7210 in FIG. 10D has two convex-curved light-emitting portions symmetrically placed. Thus, all directions can be illuminated with the lighting device 7210 as a center.

The lighting device 7220 illustrated in FIG. 10E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion can be fixed on a plastic member, a frame, or the like so that a light-emitting surface of the light-emitting portion can be curved freely depending on the intended use.

The light-emitting portions included in the lighting devices 7200, 7210, and 7220 each include the display device of one embodiment of the present invention. Thus, the light-emitting portions can be curved into any shape and the lighting devices can have high reliability.

It is needless to say that one embodiment of the present invention is not limited to the above-described electronic devices and lighting devices as long as the display device of one embodiment of the present invention is included.

This embodiment can be implemented in appropriate combination with any of the structures described in the other embodiments.

Embodiment 5

In this embodiment, modification examples of the sofa in FIG. 7 which is described in Embodiment 2 are illustrated.

Figure 11A:
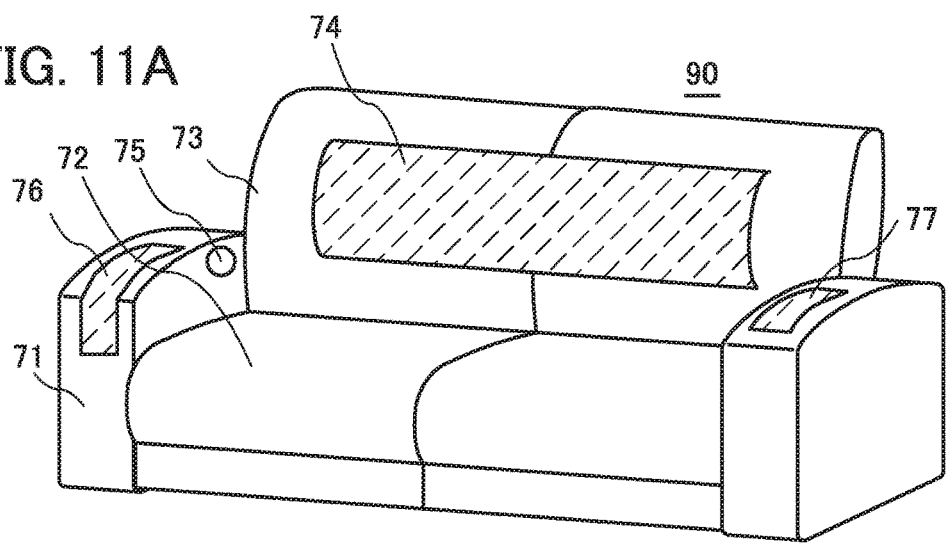
FIGS. 11A to 11C are a perspective view and cross-sectional views illustrating one embodiment of the present invention.

FIG. 11A illustrates an example of a perspective view of a sofa 90. The sofa 90 includes the leg portions 71, the seating portion 72, and the backrest portion 73. The backrest portion 73 includes the display device 74. The same portions as those in FIG. 7 are denoted by the same reference numerals in FIGS. 11A to 11C.

The display device 74 is placed on the backrest portion 73 of the sofa 90. A plurality of display panels are aligned in the width direction of the backrest portion 73 so that one image can be displayed on the display device 74.

The sofa 90 further includes input/output portions 76 and 77. The input/output portions 76 and 77 are each provided with an optical sensor or the like to measure the amount of light. According to the amount of light, display can be turned off when the user sits on the sofa. The input/output portion 77 may be formed using a display device using a flexible film. When a plurality of optical sensors are provided over one substrate, a plurality of optical sensors having different measurement areas can be provided on a curved surface, so that light from multiple directions can be sensed. The input/output portions 76 and 77 may function as touch input panels to be operated.

Figure 11B:
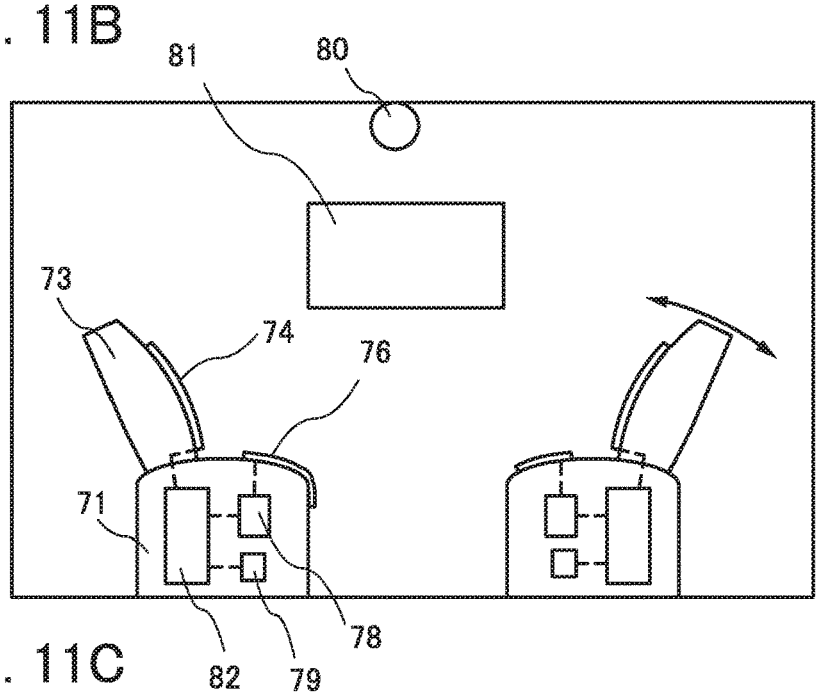
Figure 11C:
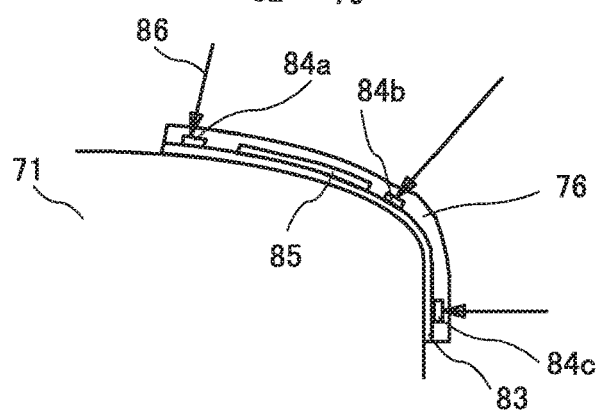

FIG. 11C illustrates an example of a cross-sectional structure of the input/output portion 76 in which a plurality of optical sensors 84a to 84c and a display portion 85 are provided over a flexible film 83. Arrows indicate the directions 86 of light measured by the optical sensors 84a to 84c. When the flexible film 83 is curved along the curved surface of the leg portion 71 to make the light-receiving directions of the optical sensors different from each other, light from multiple directions can be sensed.

Figure 12A:
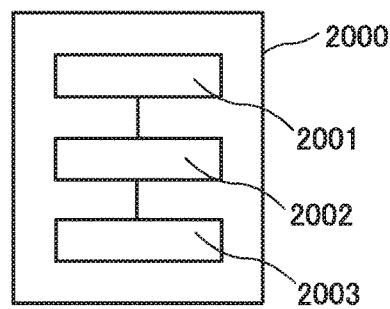
FIGS. 12A to 12C are a block diagram and cross-sectional views illustrating one embodiment of the present invention.

An example of a photoelectric conversion device 2000 that is an optical sensor is described with reference to FIG. 12A. The photoelectric conversion device 2000 has portions functioning as a sensor element group 2001, a control portion 2002, and an A/D converter circuit 2003. The sensor element group 2001 has a function of sensing light. The control portion 2002 has a function of controlling the timing of the sensor element group 2001 sensing light. The A/D converter circuit 2003 has a function of converting a current or a voltage corresponding to light sensed by the sensor element group 2001 from an analog value to a digital value. Note that various structures can be used as the structure of photoelectric conversion device 2000 without being limited to this.

As the sensor element group 2001, a photosensor utilizing an amplifying function of a MOS transistor, called a CMOS sensor, can be typically used. A CMOS sensor can be fabricated through a general CMOS process. Thus, manufacturing cost of a solid-state imaging device including a CMOS sensor in each pixel can be low, and a semiconductor device having a photosensor and a display element formed over one substrate can be realized. In addition, a CMOS sensor requires lower driving voltage than a CCD sensor; therefore, power consumption of the solid-state imaging device can be suppressed.

A solid-state imaging device including a CMOS sensor employs, for imaging, a rolling shutter method in which an operation to accumulate charge in a photodiode and an operation to read the charge are sequentially performed row by row.

Figure 12B:
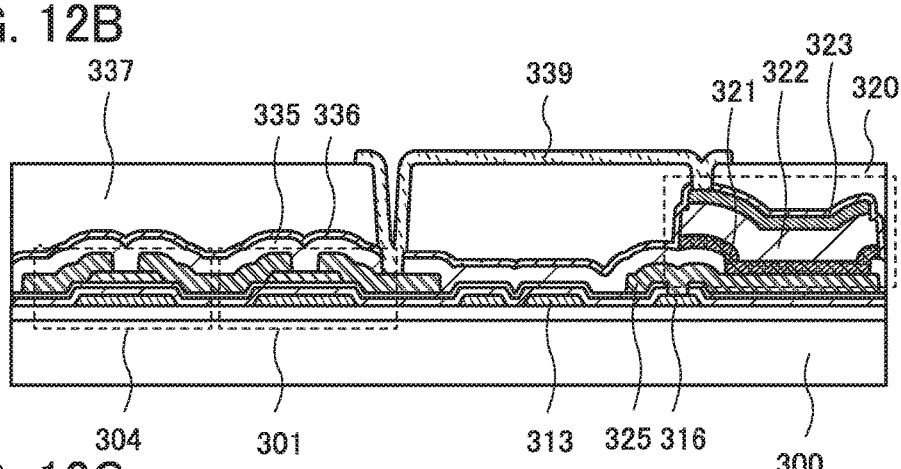

FIG. 12B illustrates an example of a cross-sectional view of an optical sensor. The optical sensor includes a transistor 301, a transistor 304, and a photoelectric conversion element 320 provided over a flexible substrate 300. The transistors illustrated in FIG. 12B are each a bottom-gate transistor including a gate electrode layer, a gate insulating film, a semiconductor layer, a source electrode layer, and a drain electrode layer as a basic structure.

Figure 15A:
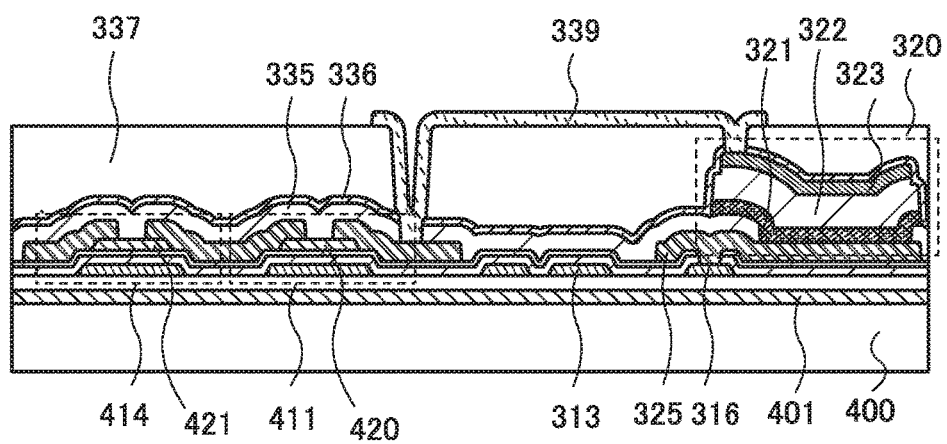
FIGS. 15A to 15C are cross-sectional views illustrating a manufacturing step of a semiconductor device of one embodiment of the present invention.
Figure 15B:
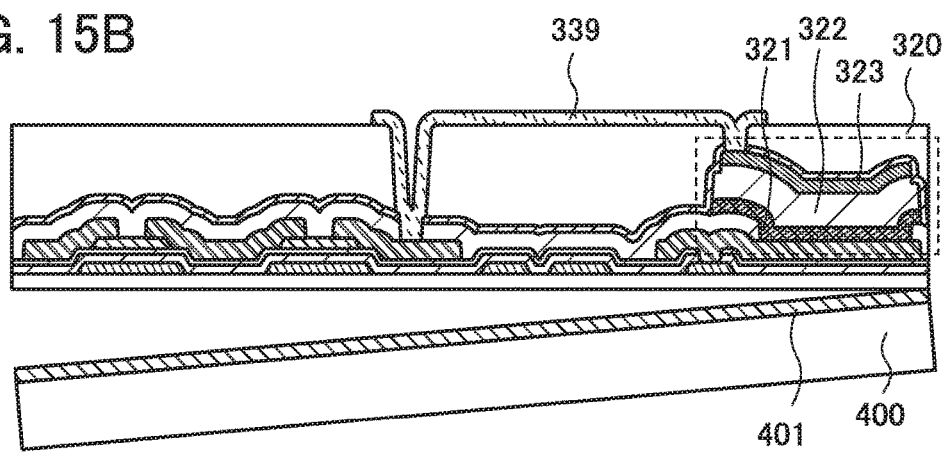
Figure 15C:
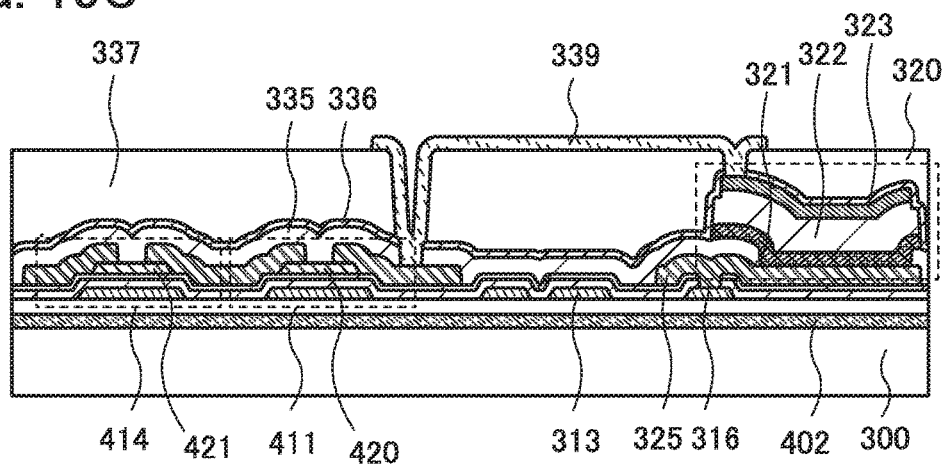

In the case where an oxide semiconductor is used for each of the semiconductor layers of the transistors 301 and 304, the transistors can be formed directly on the flexible substrate 300. In the case where a polysilicon thin film or a diamond thin film is used for each of the semiconductor layers of the transistors 301 and 304, the transistors can be formed through the following steps: a separation layer is formed over a support substrate, the transistors are formed over the separation layer, the support substrate is removed, and the flexible substrate 300 is attached. FIGS. 15A to 15C illustrate an example of a manufacturing step in the case of using the separation layer.

FIG. 15A is a cross-sectional view at the stage where a separation layer 401 is formed over a substrate 400 having high heat resistance and a light-transmitting property, such as a quartz substrate or a glass substrate, and a transistor 411, a transistor 414, and the photoelectric conversion element 320 are formed. A tungsten film or an amorphous silicon film containing hydrogen is used as the separation layer 401. The transistor 411 includes a diamond thin film 420 doped with an n-type or a p-type impurity element and the transistor 414 includes a diamond thin film 421 doped with an n-type or a p-type impurity element, for example. When the diamond thin film is used for the transistor, the tungsten film is preferably used as the separation layer 401 because heat treatment at approximately 600° C. is performed in some cases. When the amorphous silicon film containing hydrogen is used, a substrate having a light-transmitting property is used as the substrate 400 because separation is performed by laser light irradiation.

Next, as illustrated in FIG. 15B, the substrate 400 and the separation layer 401 are separated from each other.

After the separation, the flexible substrate 300 is attached using a bonding layer 402. A cross-sectional view at this stage corresponds to FIG. 15C.

Figure 16A:
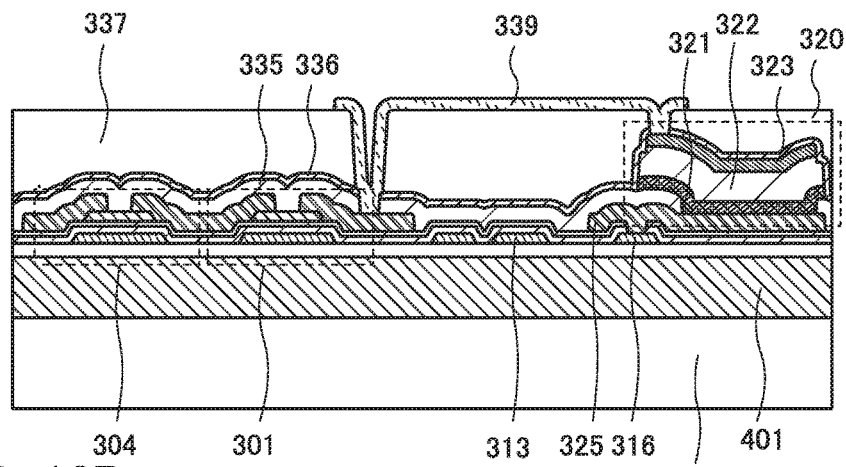
FIGS. 16A to 16C are cross-sectional views illustrating a manufacturing step of a semiconductor device of one embodiment of the present invention.
Figure 16B:
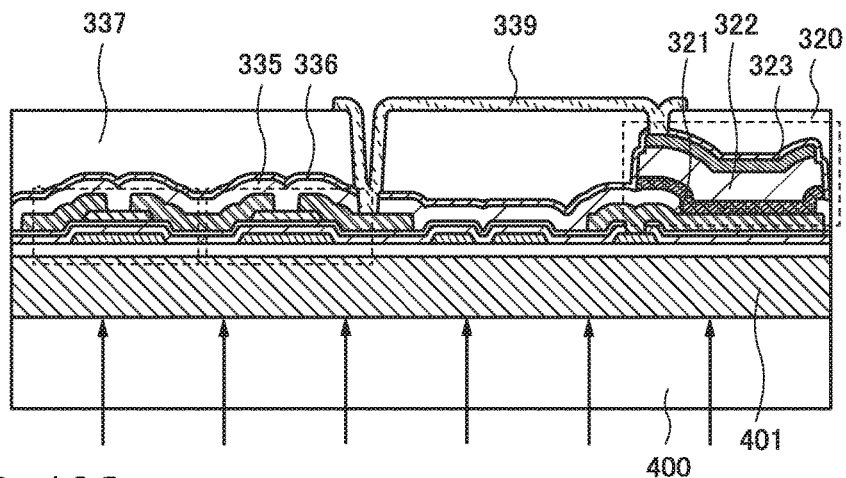
Figure 16C:
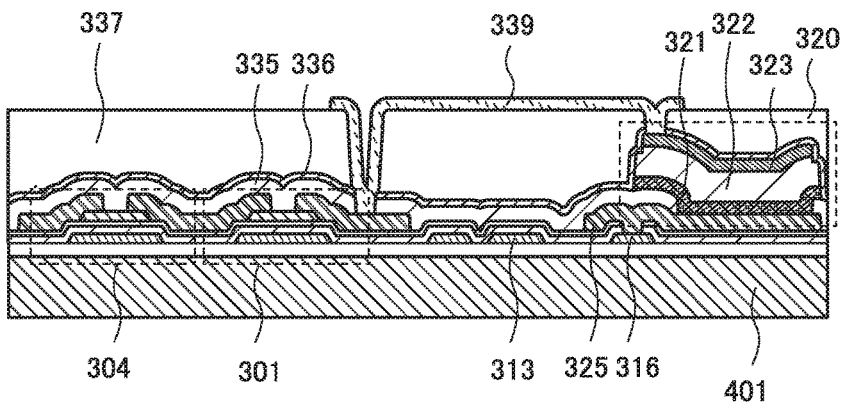

The manufacturing method is not limited to the manufacturing method using the separation layer which is described with reference to FIGS. 15A to 15C, and the separation may be performed by another known method. For example, as illustrated in FIG. 16A, a resin layer such as a polyimide layer is used as the separation layer 401 in some cases. In that case, as illustrated in FIG. 16B, the separation occurs at a separation layer surface irradiated with laser light, that is, the interface between the substrate 400 having the light-transmitting property and the separation layer 401 and consequently, the separation layer 401 can be used as the flexible substrate after the substrate 400 is removed as illustrated in FIG. 16C.

The photoelectric conversion element 320 includes a semiconductor layer provided over a conductive layer 325. The semiconductor layer includes a p-type semiconductor layer 321, an i-type semiconductor layer 322, and an n-type semiconductor layer 323 in this order from the conductive layer 325 side. The conductive layer 325 can function as an anode electrode of the photoelectric conversion element 320. A light-transmitting conductive film functioning as a cathode electrode may be provided over a top surface of the n-type semiconductor layer 323. Amorphous silicon, microcrystalline silicon, polycrystalline silicon, or the like is used as the semiconductor layer.

Here, an insulating layer 335 is provided over the transistor 301, the transistor 304, and part of the conductive layer 325. The insulating layer 335 is a film that is in contact with channel regions of the transistors, and is preferably a film in which defects are less likely to be generated at the interface with the semiconductor layers of the transistors. For example, a silicon oxide film or a silicon oxynitride film can be used as the insulating layer 335.

As illustrated in FIG. 12B, the photoelectric conversion element 320 includes a region where the insulating layer 335 is provided between the conductive layer 325 and an end portion of the semiconductor layer and the vicinity of the end portion. This structure prevents etching of the conductive layer 325 in a step of processing the semiconductor layer and contamination of the semiconductor layer by components of the conductive layer 325.

An insulating layer 336 can be provided over the insulating layer 335 and in contact with the semiconductor layer of the photoelectric conversion element 320. For example, a silicon nitride film, an aluminum oxide film, or the like can be used as the insulating layer 336. Alternatively, an aluminum nitride film, an aluminum oxynitride film, an aluminum nitride oxide film, a gallium oxide film, a gallium oxynitride film, an yttrium oxide film, an yttrium oxynitride film, a hafnium oxide film, a hafnium oxynitride film, an yttria-stabilized zirconia (YSZ) film, or the like may be used.

An insulating layer 337 is formed over the insulating layer 336. As the insulating layer 337, an organic resin such as an acrylic resin or a polyimide resin can be used as well as an inorganic film such as a silicon oxide film. A contact hole is formed in the insulating layer 337, whereby the transistor 301 can be electrically connected to the photoelectric conversion element 320 through a conductive layer 339 provided in the contact hole.

A light-transmitting conductive film can be used as the conductive layer 339. That is, a surface on the conductive layer 339 side of the photoelectric conversion element 320 is a light-receiving surface. For the light-transmitting conductive film, the following can be used: indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, graphene, and the like. The conductive layer 339 is not limited to a single layer and may be a stack of the above-described light-transmitting conductive films.

An oxide semiconductor, amorphous silicon, microcrystalline silicon, or polycrystalline silicon may be used for each of the semiconductor layers included in the transistors 301 and 304.

For the conductive layer 325, a metal such as titanium, aluminum, tungsten, molybdenum, or tantalum, or a light-transmitting conductive film which can be used as the conductive layer 339 can be typically used.

Although FIG. 12B illustrates an example in which a pin photodiode using silicon is used as the photoelectric conversion element 320 as described above, a pn photodiode using single crystal silicon may also be used. Alternatively, an element that includes a layer containing selenium or a compound of copper, indium, and selenium (CIS) may be used. Alternatively, an element that includes a layer containing a compound of copper, indium, gallium, and selenium (CIGS) may be used.

Figure 12C:
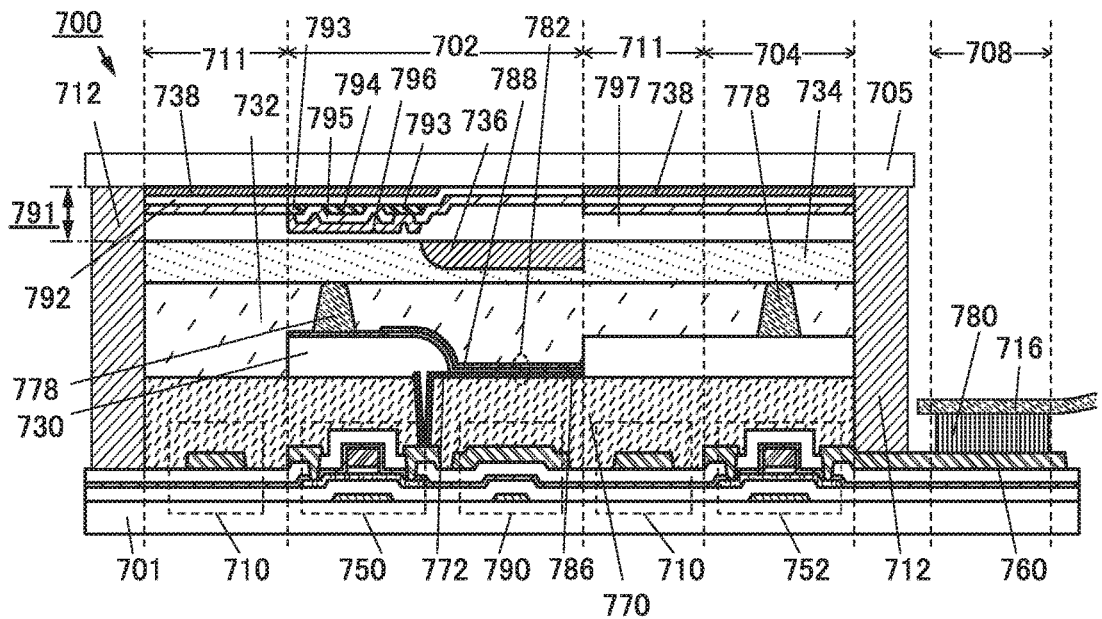

FIG. 12C illustrates an example in which as an input/output portion 700, a display portion and a touch input portion are formed over a first flexible substrate 701.

The input/output portion 700 includes a pixel portion 702 provided over the first flexible substrate 701, a source driver circuit portion 704 and a gate driver circuit portion provided over the first flexible substrate 701, a sealant 712 provided to surround the pixel portion 702, the source driver circuit portion 704, and the gate driver circuit portion, and a second flexible substrate 705 provided to face the first flexible substrate 701.

The pixel portion 702, the source driver circuit portion 704, and the gate driver circuit portion included in the input/output portion 700 include a plurality of transistors.

The pixel portion 702 serving as the display portion can include a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

A coloring layer (also referred to as a color filter) may be used to obtain a full-color display device in which white light (W) is used for a backlight (e.g., an organic EL element, an inorganic EL element, an LED, or a fluorescent lamp). As the coloring layer, red (R), green (G), blue (B), yellow (Y), or the like may be combined as appropriate, for example.

A transistor using an oxide semiconductor or a transistor using polysilicon is used as each of a transistor 750 and a transistor 752.

A capacitor 790 includes a lower electrode that is formed through a step of processing the same conductive film as a conductive film functioning as a first gate electrode of the transistor 750 and an upper electrode that is formed through a step of processing the same conductive film as a conductive film functioning as a source electrode or a drain electrode of the transistor 750. Furthermore, between the lower electrode and the upper electrode, an insulating film that is formed through a step of forming the same insulating film as an insulating film functioning as a first gate insulating film of the transistor 750 and an insulating film that is formed through a step of forming the same insulating film as an insulating film functioning as a protective insulating film of the transistor 750 are provided. That is, the capacitor 790 has a stacked-layer structure in which the insulating films functioning as a dielectric film are positioned between a pair of electrodes.

In FIG. 12C, a planarization insulating film 770 is provided over the transistor 750, the transistor 752, and the capacitor 790.

Although FIGS. 11A to 11C and FIGS. 12A to 12C each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion".

A signal line 710 is formed through the same process as the conductive films functioning as source electrodes and drain electrodes of the transistors 750 and 752. In the case where the signal line 710 is formed using a material including a copper element, signal delay or the like due to wiring resistance is reduced, which enables display on a large screen.

An FPC terminal portion 708 includes a connection electrode 760, an anisotropic conductive film 780, and an FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

A flexible film is used as each of the first flexible substrate 701 and the second flexible substrate 705.

A structure body 778 is provided between the first flexible substrate 701 and the second flexible substrate 705. The structure body 778 is a columnar spacer obtained by selective etching of an insulating film and is provided to control the distance (cell gap) between the first flexible substrate 701 and the second flexible substrate 705. Note that a spherical spacer may be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second flexible substrate 705 side.

The input/output portion 700 includes a light-emitting element 782. The light-emitting element 782 includes a conductive film 772, an EL layer 786, and a conductive film 788. The input/output portion 700 illustrated in FIG. 12C is capable of displaying an image by light emission from the EL layer 786 included in the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. The quantum dot containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The EL layer 786 can be formed using the above-described organic compound and the inorganic compound by a method such as an evaporation method (including a vacuum evaporation method), a droplet discharging method (also referred to as an ink-jet method), a coating method, or a gravure printing method. A low molecular material, a middle molecular material (including an oligomer and a dendrimer), or a high molecular material may be included in the EL layer 786.

In the input/output portion 700 illustrated in FIG. 12C, an insulating film 730 is provided over the planarization insulating film 770 and the conductive film 772. The insulating film 730 covers part of the conductive film 772. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 772 side, or a dual-emission structure in which light is emitted to both the conductive film 772 side and the conductive film 788 side may be employed.

The coloring film 736 is provided to overlap with the light-emitting element 782, and the light-blocking film 738 is provided to overlap with the insulating film 730 and to be included in a lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the input/output portion 700 in FIG. 12C, the structure is not limited thereto. In the case where the EL layer 786 is formed by a separate coloring method, the coloring film 736 is not necessarily provided.

The input/output portion 700 illustrated in FIG. 12C is provided with a touch panel 791.

The touch panel 791 is what is called an in-cell touch panel provided between the substrate 705 and the coloring film 736. The touch panel 791 is formed on the substrate 705 side before the light-blocking film 738 and the coloring film 736 are formed.

The touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

An intersection of the electrode 793 and the electrode 794 above the transistor 750 is clearly shown in FIG. 12C. Through openings in the insulating film 795, the electrode 796 is electrically connected to the two electrodes 793 between which the electrode 794 is positioned. Although the electrode 796 is formed in the pixel portion 702 in FIG. 12C, this embodiment is not limited to this example, and the electrode 796 may be formed in the source driver circuit portion 704, for example.

The electrodes 793 and 794 are provided in a region overlapping with the light-blocking film 738. As illustrated in FIG. 12C, it is preferable that the electrode 793 do not overlap with the light-emitting element 782. In other words, the electrode 793 has an opening in a region overlapping with the light-emitting element 782. That is, the electrode 793 has a mesh shape. With this structure, the electrode 793 does not block light emitted from the light-emitting element 782. Thus, since luminance is hardly reduced even when the touch panel 791 is placed, a display device with high visibility and low power consumption can be achieved. Note that the electrode 794 can have a similar structure.

In addition, since the electrodes 793 and 794 do not overlap with the light-emitting element 782, the electrodes 793 and 794 can be formed using a metal material with low visible light transmittance.

Accordingly, the resistance of the electrodes 793 and 794 can be reduced as compared with an electrode using an oxide material with high visible light transmittance, so that the sensitivity of the touch panel can be increased.

For example, conductive nanowires may be used for the electrodes 793, 794, and 796. The nanowires has a mean diameter greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a metal nanowire such as an Ag nanowire, a Cu nanowire, or an Al nanowire, a carbon nanotube, or the like is used. For example, in the case of using an Ag nanowire for one or all of the electrodes 793, 794, and 796, a visible light transmittance of 89% or more and a sheet resistance of 40 Ω/square or more and 100 Ω/square or less can be achieved.

Although a structure of the in-cell touch panel in the input/output portion 700 in FIG. 12C is described, the structure is not limited thereto.

Although the number of manufacturing steps increases, the structures of FIGS. 12B and 12C can also be formed over one substrate. For example, a light-emitting element, a transistor driving the light-emitting element, a photoelectric conversion element, and a transistor driving the photoelectric conversion element may be formed over a flexible substrate in order to improve the degree of integration.

A portable information terminal such as a smartphone may be charged by being put on the input/output portions 76 and 77. The input/output portions 76 and 77 may include an antenna so as to be capable of wireless communication with a portable information terminal such as a smartphone when the portable information terminal approaches. Furthermore, the input/output portions 76 and 77 may include a connector connected to another electronic device with a wire. The input/output portion 76 can be provided with an imaging device so that an image is captured and analyzed to determine whether a person indoors is in a recumbent position, a sitting position, or a standing position.

The sofa 90 includes, in addition to the flexible display device 74, a speaker 75, a control device for controlling them, a power supply device required for operation thereof, and the like. When the sofa 90 includes a CPU or the like as the control device, the sofa 90 can be regarded as a kind of information processing terminal.

FIG. 11B shows a lighting device 80 on a ceiling, a cross-sectional structure of a pair of sofas near the center, and a window 81 on a wall. A control portion 78 of the input/output portion 76 is electrically connected to an optical sensor of the input/output portion 76 and can measure the amount of light. A communication portion 79 can communicate with another device with or without a wire.

When the sofa includes a temperature sensor, a clock function, an internet connection interface, or the like as the input/output portion 76 and the cloud is used via Internet connection, the date or user's schedule can be acquired and displayed on a standby screen of a display portion, which displays no image, as an information screen. In the standby screen, the news or the like in simple letters can be displayed.

In a guest room, a waiting room, or the like, a pair of sofas or a pair of chairs is often disposed. In that case, since the display device is disposed at a distance from the sofas and at a high position, a large screen is needed. In an alternative arrangement, the display device is watched from the side while a person sits on the sofa. When persons sit on the pair of sofas, the opposite sofa hinders vision; consequently, the display device is disposed at a distance from the sofas and at a high position and a large screen is needed.

When the backrest portion of the sofa is provided with the display device, a region where the person does not sit on can be used as a display screen, so that the person can watch the display device in a comfortable position.

The amount of light from the lighting device and the display of the sofa in the room illustrated in FIG. 11B can also be adjusted. For example, when the input/output portion 76 of the sofa senses the state where a user enters the room, the lighting device 80 is turned on. In addition, when the user sits on one of the pair of sofas, the display device of the other of the pair of sofas can be turned on.

The amount of light from the lighting device or an image to be displayed on the display device of the sofa may be controlled in accordance with the amount of light incident through the window 81. For example, when the user watches a movie, the periphery of the screen may be darkened so that contrast is enhanced.

A power supply device 82 of the sofa includes a video output portion for output to the display device 74 in addition to a power source such as a secondary battery. Although a power code for supplying a power to the power source in the sofa may be provided, non-contact power supply may be employed.

A power storage device with high capacity including a plurality of secondary batteries may be provided in the sofa so that a system in which the stored power is distributed to other electronic devices may be employed. The display portion provided on the sofa can also be used as emergency lighting in case of a power failure by using the power stored in the power storage device. A conventional household power source is often provided outdoors; however, when the power storage device is provided in the sofa, that is, provided indoors, the effect of the external environment can be reduced and a power transmission distance can also be reduced. In addition, the incorporation in the sofa does not cause any problems with an installation space. Since the sofa needs to be sufficiently heavy, the weight of the power storage device can also be utilized.

The set value of household electricity (also referred to as a contract ampere) can be changed; however, when the electric power exceeds the value, a breaker is tripped and a power failure occurs. Thus, it is convenient having a device or a system which can manage electricity so as to prevent the tripping of the breaker. When the sofa includes a secondary battery, the display device can replace lighting in case of a power failure.

This embodiment can be freely combined with any of the other embodiments. This embodiment can be freely combined with Embodiment 6. For example, when a sensor which measures the amount of light is provided in the input/output portion 76 or the input/output portion 77 of the sofa or the like, the device in FIGS. 11A to 11C can be used as a second display device which will be described in Embodiment 6.

Although an example of the pair of sofas is illustrated in FIG. 11B, this embodiment can be applied to the case where there are one sofa and one display device in a room.

A portable information terminal such as a smartphone can be used as the second display device and the device in FIGS. 11A to 11C can be used as a third display device.

The pair of sofas can be regarded as a first display device and the second display device and a management system which will be described in Embodiment 6 can be applied to the pair of sofas.

Transmission with a server computer allows use with a portable information terminal such as a smartphone. Furniture such as the sofa or the chair can also be regarded as a household appliance and can be managed or operated with a portable information terminal such as a smartphone.

In the case where furniture such as the sofa is regarded as a kind of household appliance as illustrated in FIG. 11A, a space in which a household appliance (e.g., a television, a speaker, or lighting) is provided can be reduced; accordingly, a living space can be used more efficiently.

Although the sofas illustrated in FIGS. 11A and 11B have a wide width shape for a plurality of people, the efficient use is also possible when the display devices are placed as foldable chairs arranged in rows in an amusement facility such as a movie theater.

In addition to the sofas illustrated in FIGS. 11A and 11B, this embodiment can be applied to a sofa bed which becomes a bed when a backrest is reclined.

Embodiment 6

Figure 13:
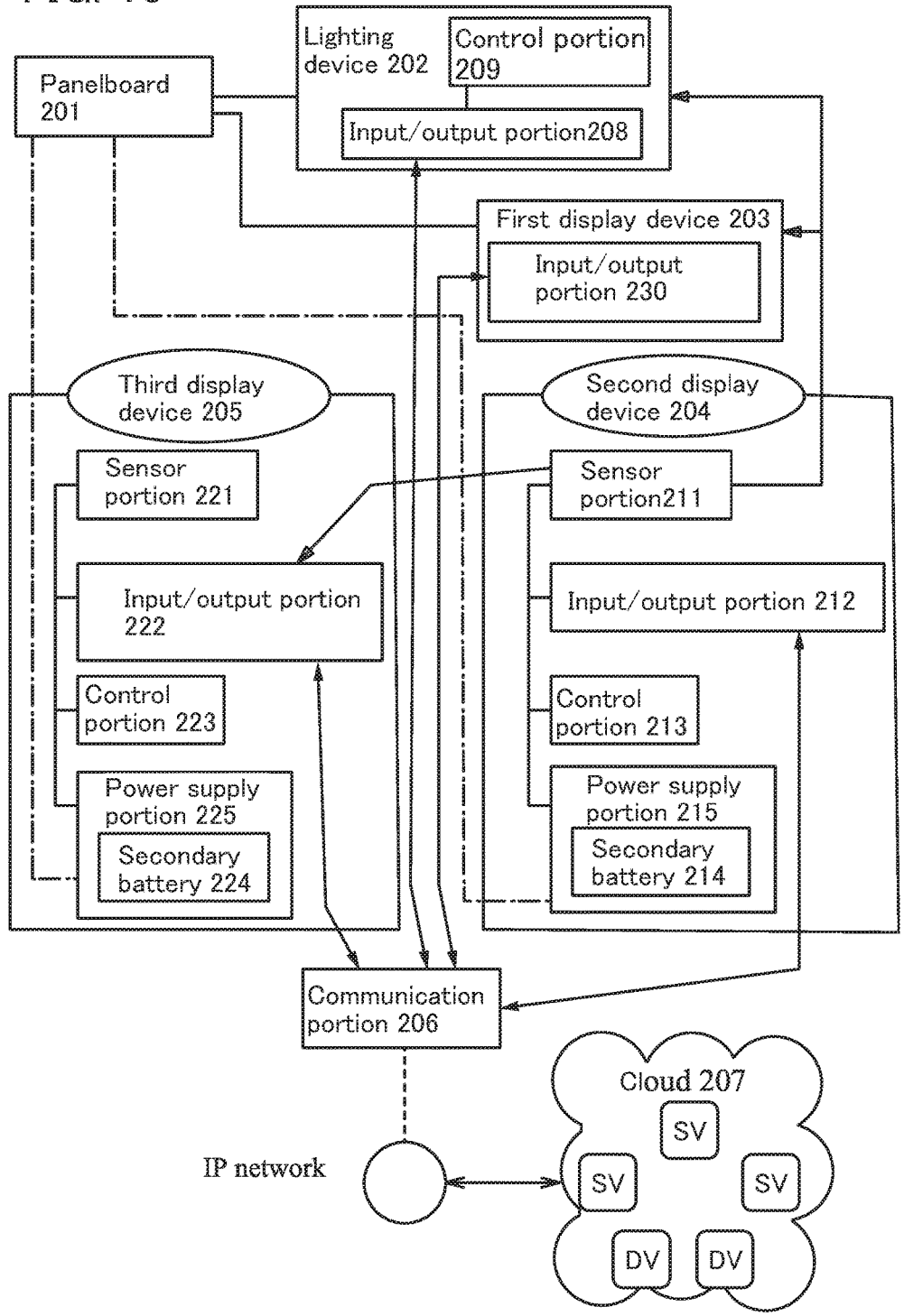
FIG. 13 is a block diagram illustrating one embodiment of the present invention.

FIG. 13 is a block diagram illustrating a structure of a management system.

Since FIG. 13 shows an example of the management system of an indoor display device, the description will start from a panelboard 201 in which electricity distributed from electric power equipment is supplied through a transformer, an electricity meter (also referred to as a smart meter), or the like.

The panelboard 201 supplies electric power to electric devices (e.g., a lighting device 202 and a first display device 203) electrically connected to the panelboard through an electric grid or the like. The electric device is detachably connected to the electric grid through an outlet or the like.

A home network such as a wired LAN or a wireless LAN is formed indoors. A second display device 204 or a third display device 205 placed indoors is detachably and directly or indirectly connected to another device through an Internet protocol (IP) network, the wireless LAN, or the like. A communication portion 206 placed indoors or outdoors can communicate with a server computer SV, receive data from a database DV, or store data in a database DV, for example.

A cloud 207 includes at least one or a plurality of server computers SV, and one or a plurality of databases DV.

The cloud 207 includes at least an acquiring portion acquiring display data displayed on the first display device, a predicting portion predicting deterioration of a display portion of the first display device on the basis of information of the acquired display data, a display data formation portion forming display data for suppressing the deterioration in the display portion of the first display device on the basis of the amount of light acquired in the acquiring portion, and a control portion selecting a display device to which the formed display data is output and determining the amount of light from the lighting device.

For example, the acquiring portion, the predicting portion, the display data formation portion, and the control portion are functional objects distributed in the cloud 207. The acquiring portion, the predicting portion, the display data formation portion, and the control portion are achieved as a program to be executed by one of the server computers SV distributed in the cloud 207.

An example of a process of an operation for optimizing a display environment of the display portion of the first display device will be described with reference to a flow chart shown in FIG. 14.

In order to control the indoor electronic device (the lighting device 202 or the first display device 203), a sensor portion 211 included in the second display device 204 is used. An example in which the first display device 203 is a stationary television placed indoors and the second display device 204 is a portable information terminal (e.g., a smartphone) possessed by a user will be described.

First, the sensor portion 211 included in the second display device 204 that is the portable information terminal possessed by the user measures the amount of light from an electronic device in which the power is turned on, whereby the total amount of light around the user is acquired (Step S1-1). Specifically, the total amount of light is a sum of the amount of light received from the lighting device 202, the first display device, and another light source and the sunlight from the outside. Since the value varies according to the direction of measurement by the sensor portion 211, the user determines the position of the second display device 203. Specifically, the user sits so as to watch the first display device and places and makes the sensor portion 211 face in the direction in which light from the first display device can be measured. When the second display device 204 is a head mounted display, light from the first display device can be measured accurately by turning a face toward the first display device.

The second display device 204 includes an input/output portion 212 including a display portion, a control portion 213, and a power supply portion 215 in addition to the sensor portion 211. The power supply portion 215 includes a secondary battery 214. A CPU placed in the control portion 213 included in the second display device 204 determines whether lighting luminance needs to be changed or not on the basis of the acquired amount of light (Step S1-2). Alternatively, data on the amount of light is transmitted to the cloud, and one of the server computers SV distributed in the cloud 207 determines whether the lighting luminance needs to be changed or not on the basis of the acquired amount of light. Note that the timing of acquiring the amount of light by the sensor portion 211 may be regular automation or determined by the user.

In the case where the lighting luminance needs to be changed, a control signal determining the amount of light from the lighting device is formed (Step S1-3). In the case where the lighting luminance does not need to be changed, the amount of light is measured and determination of the need for the change is repeated regularly. The control signal is formed by the CPU included in the second display device 204 or one of the server computers SV distributed in the cloud 207.

A signal for change into the determined amount of light is transmitted to the lighting device 202 through the communication portion 206 (Step S1-4). On the basis of the control signal, the amount of light from the lighting device is adjusted by a control portion 209 of the amount of light through an input/output portion 208 included in the lighting device 202. Note that the communication portion 206 and the input/output portion 208 included in the lighting device 202 are connected to each other with or without a wire.

In the case where the amount of light from the lighting device is determined desirably zero, the lighting device is turned off. The process in the flow chart shown on the left side of FIG. 14 also applies even when the first display device is turned off. In other words, the flow chart represents a control system of the indoor lighting device utilizing the second display device.

Figure 14:
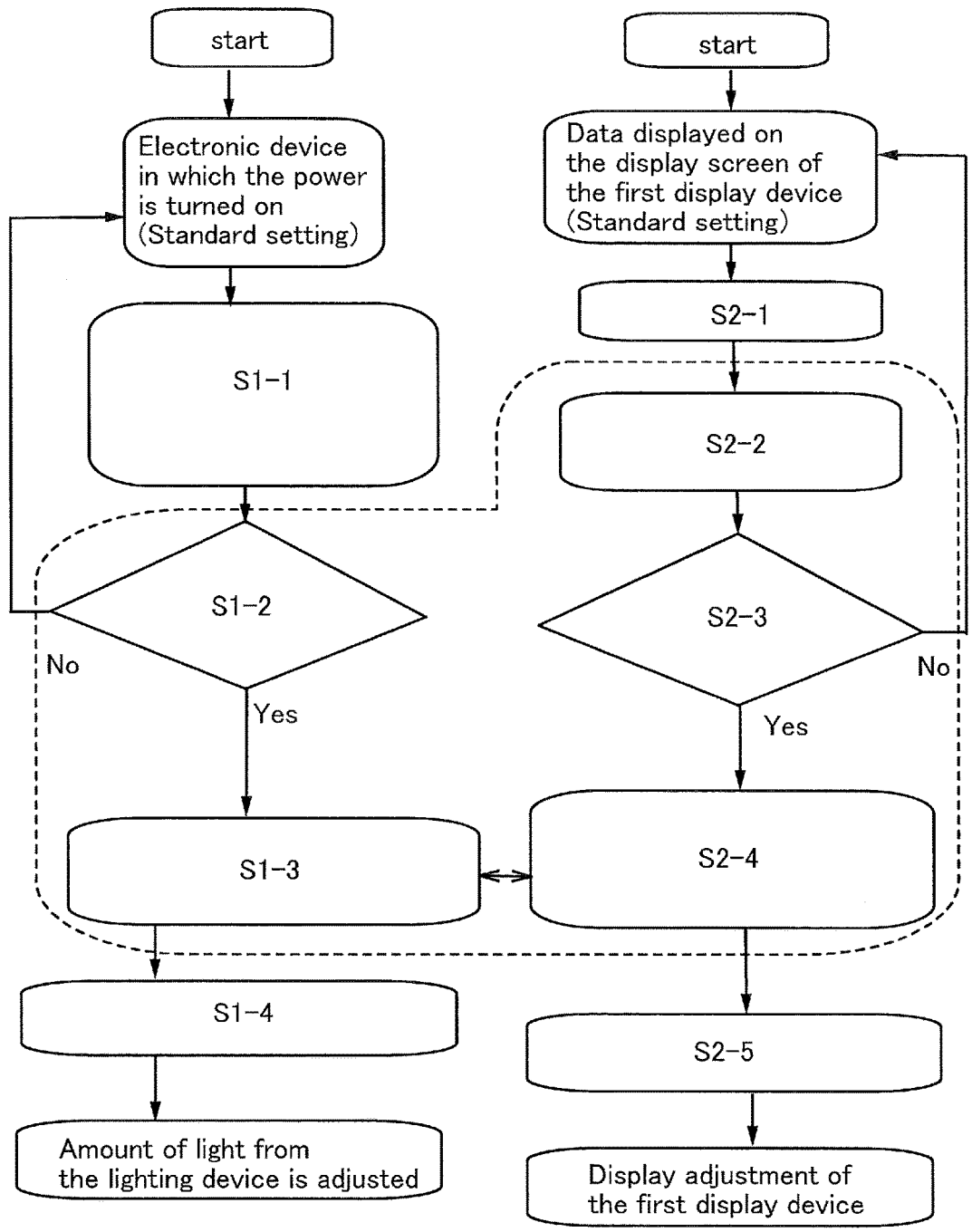
FIG. 14 is a flow chart showing examples of steps.

The flow chart shown on the right side of FIG. 14 shows a management system that predicts a local deterioration position in a display screen of the first display device and forms display data for suppressing the deterioration.

Data displayed on the display screen of the first display device is transmitted from an input/output portion 230 to the cloud 207 through the communication portion 206 and the display data is acquired (Step S2-1). Note that the communication portion 206 and the input/output portion 230 included in the first display device 203 are connected to each other with or without a wire.

One of the server computers SV distributed in the cloud 207 predicts the deterioration position of the display portion of the first display device on the basis of the acquired and accumulated display data (Step S2-2). The prediction of the deterioration position is desirably performed for each pixel; however, the display area may be divided so that the deterioration prediction may be performed for each of the divided areas.

Then, one of the server computers SV distributed in the cloud 207 determines whether the display data needs to be changed or not on the basis of the accumulated display data (Step S2-3).

In the case where the display data needs to be changed, the display data for suppressing the deterioration of the display portion of the first display device is formed (Step S2-4). In the case where the display data does not need to be changed, accumulation of the display data is continued and determination of the need for the change is repeated regularly. One or the plurality of server computers SV distributed in the cloud 207 forms the display data.

The display data for suppressing the deterioration is transmitted to the first display device through the communication portion 206 (Step S2-5). On the basis of the display data, display adjustment of the first display device 203 is performed through the input/output portion 230 included in the first display device 203.

Since the display data is formed on the basis of an enormous amount of data, the use of the cloud 207 is effective. Furthermore, a setting of the amount of light from the lighting device and suppressing the deterioration of the first display device can be performed in consideration of the lighting device and the first display device as in FIG. 14. When the user watches the first display device, there is a close relationship between the setting of the amount of light from the lighting device and the display of the first display device and accordingly, there is an effective advantage.

In the case where the display data needs to be changed, the broadcasted video information is difficult to display on the display screen of the first display device in real time. Accordingly, this system is effective in the case where the first display device is switched to the display mode in which the deterioration is suppressed when the first display device displays a reproduced image stored in a storage medium or the like.

With the display data for suppressing the deterioration, the quality of a displayed image differs from a standard and therefore an image whose quality does not attract the user's attention is preferably displayed. For example, a commercial break, the news, a program listing, or a screen saver is set to be displayed automatically. The system can prevent burn-in of the display image or the like.

Although the above flow charts are described using the first display device 203 and the lighting device 202 for simplicity, the third display device 205 illustrated in FIG. 13 can be further added and the optimization of a display environment is again performed. The third display device 205 includes an input/output portion 222 including a display portion, a control portion 223, and a power supply portion 225 in addition to a sensor portion 221. The power supply portion 225 includes a secondary battery 224.

For example, when the on/off state of the first display device is switched in accordance with video display data, the using time of the first display device can be shortened, which extends the lifetime of the first display device. In the case where the first display device is a stationary television, the second display device is a portable information terminal such as a smartphone, and the third display device is a tablet device, device switching can be automatically performed; the first display device is used when the user watches a high-resolution image, and the first display device is turned off and the third display device is turned on when the user watches the image which does not need high resolution such as a commercial break, the news, or a program listing. Note that the amount of light from the lighting device is reduced when the user watches the high-resolution image with the first display device and the amount of light from the lighting device is increased when the user watches the image with the third display device.

In particular, when the first display device is an organic EL display device, it is effective to turn the screen into black display in which a light-emitting element does not emit light because power consumption can be significantly reduced.

Although an example of the management system of the display device in which adjustment of the amount of light from the lighting device and display switching of the display device are performed using the cloud is described in this embodiment, there is no particular limitation, and the management system of the display device can also be achieved when an API through the web is used instead of the cloud.

This application is based on Japanese Patent Application serial no. 2015-195163 filed with Japan Patent Office on Sep. 30, 2015 and Japanese Patent Application serial no. 2016-015357 filed with Japan Patent Office on Jan. 29, 2016, the entire contents of which are hereby incorporated by reference.

What is claimed is:

1. A display device comprising:
   a first wiring over a flexible film;
   a second wiring over the flexible film;
   an insulating layer over the first wiring and the second wiring; and
   a viscoelastic high molecular material layer over the insulating layer,
   wherein the insulating layer comprises a plurality of openings,
   wherein a top surface and a side surface of each of the first wiring and the second wiring overlapping with at least one of the plurality of openings are in contact with a conductive layer comprising a metal nanoparticle,
   wherein the conductive layer is in contact with the viscoelastic high molecular material layer,
   wherein the first wiring and the second wiring are electrically connected to each other through the conductive layer, wherein the flexible film is bent at a portion of the plurality of openings in the insulating layer and heated in a state of being bent, and wherein the plurality of openings are aligned in a line and covered with the conductive layer.

2. The display device according to claim 1,
wherein the first wiring is electrically connected to a transistor over the flexible film, and
wherein the transistor comprises an oxide semiconductor.

3. The display device according to claim 1,
wherein the first wiring is electrically connected to a transistor over the flexible film, and
wherein the transistor comprises a semiconductor comprising a Group 14 element.

4. The display device according to claim 1,
wherein the first wiring is electrically connected to a transistor over the flexible film, and
wherein the transistor comprises a semiconductor formed with an aggregate of diamonds each having a crystal size less than 1 µm.

5. An electronic device comprising the display device according to claim 1, wherein the flexible film is fixed to a member made of a shock absorbing material.

6. An electronic device comprising the display device according to claim 1, wherein a part of the flexible film is fixed to a curved surface.

7. An electronic device comprising the display device according to claim 1, wherein the flexible film is fixed to a backrest portion or a seating portion of a chair.

8. A display device comprising:
a wiring over a flexible film;
an insulating layer over the wiring; and
a viscoelastic high molecular material layer over the insulating layer,
wherein the insulating layer comprises a plurality of openings,
wherein the wiring overlaps with the plurality of openings,
wherein a top surface and a side surface of the wiring are in contact with the viscoelastic high molecular material layer through at least one of the openings,
wherein the flexible film is bent at a portion of the plurality of openings in the insulating layer and heated in a state of being bent,
wherein the plurality of openings are aligned in a line and covered with the viscoelastic high molecular material layer, and
wherein the viscoelastic high molecular material layer comprises a resin.

9. The display device according to claim 8,
wherein the wiring is electrically connected to a transistor over the flexible film, and
wherein the transistor comprises an oxide semiconductor.

10. The display device according to claim 8,
wherein the wiring is electrically connected to a transistor over the flexible film, and
wherein the transistor comprises a semiconductor comprising a Group 14 element.

11. The display device according to claim 8,
wherein the wiring is electrically connected to a transistor over the flexible film, and
wherein the transistor comprises a semiconductor formed with an aggregate of diamonds each having a crystal size less than 1 µm.

12. An electronic device comprising the display device according to claim 8, wherein the flexible film is fixed to a member made of a shock absorbing material.

13. An electronic device comprising the display device according to claim 8, wherein a part of the flexible film is fixed to a curved surface.

14. An electronic device comprising the display device according to claim 8, wherein the flexible film is fixed to a backrest portion or a seating portion of a chair.

15. The display device according to claim 8, wherein the resin comprises silicon or fluorine.

16. An electronic device comprising:
a plurality of display panels each including a flexible film;
a viscoelastic high molecular material layer covering the plurality of display panels;
a first wiring and a second wiring over each of the flexible films; and
an insulating layer over the first wiring and the second wiring,
wherein the insulating layer comprises a plurality of openings,
wherein a top surface and a side surface of each of the first wiring and the second wiring overlapping with at least one of the plurality of openings are in contact with a conductive layer comprising a metal nanoparticle,
wherein the conductive layer is in contact with the viscoelastic high molecular material layer,
wherein the first wiring and the second wiring are electrically connected to each other through the conductive layer,
wherein the flexible film is bent at a portion of the plurality of openings in the insulating layer and heated in a state of being bent,
wherein the plurality of openings are aligned in a line and covered with the conductive layer,
wherein the viscoelastic high molecular material layer comprises a resin,
wherein the plurality of display panels are aligned in one direction and form one display screen,
wherein the flexible films of the adjacent display panels comprise regions overlapping with each other, and
wherein a portion in which the flexible films overlap with each other has a curved surface.

17. The electronic device according to claim 16, wherein the flexible film is fixed to a member made of a shock absorbing material.

18. The electronic device according to claim 16, wherein the flexible film is fixed to a backrest portion or a seating portion of a chair.

* * * * *